US012575267B2

(12) United States Patent     (10) Patent No.:    US 12,575,267 B2
Xu et al.                          (45) Date of Patent:        Mar. 10, 2026

(54) DISPLAY SUBSTRATE AND PREPARATION METHOD THEREFOR, AND DISPLAY APPARATUS

(71) Applicants:Beijing BOE Technology Development Co., Ltd., Beijing (CN); BOE Technology Group Co., Ltd., Beijing (CN)

(72) Inventors: Jingjing Xu, Beijing (CN); Pan Li, Beijing (CN); Dacheng Zhang, Beijing (CN)

(73) Assignees: Beijing BOE Technology Development Co., Ltd., Beijing (CN); BOE Technology Group Co., Ltd., Beijing (CN)

( * ) Notice:     Subject to any disclaimer, the term of this patent is extended or adjusted under 35 U.S.C. 154(b) by 377 days.

(21) Appl. No.:     18/034,400

(22) PCT Filed:     Jun. 28, 2022

(86) PCT No.:     PCT/CN2022/101807
§ 371 (c)(1),
(2) Date:     Apr. 28, 2023

(87) PCT Pub. No.: WO2023/280012
PCT Pub. Date: Jan. 12, 2023

(65)          Prior Publication Data
US 2024/0008313 A1     Jan. 4, 2024

(30)     Foreign Application Priority Data
Jul. 7, 2021     (CN) .......................... 202110764582.0

(51) Int. Cl.
*H10K 59/122*          (2023.01)
*H10K 59/131*          (2023.01)
(Continued)

(52) U.S. Cl.
CPC ......... *H10K 59/122* (2023.02); *H10K 59/131* (2023.02); *H10K 59/351* (2023.02);
(Continued)

(58) Field of Classification Search
None
See application file for complete search history.

(56)          References Cited

U.S. PATENT DOCUMENTS

2013/0127326 A1     5/2013   Asaki
2018/0210277 A1     7/2018   Wang et al.
(Continued)

FOREIGN PATENT DOCUMENTS

CN          104880851 A     9/2015
CN          206209239 U     5/2017
(Continued)

OTHER PUBLICATIONS

European Search Report of the European application No. 22836766. 0, issued on Oct. 25, 2024.
International Search Report for PCT/CN2022/101807 Mailed Aug. 17, 2022.
Office Action dated Aug. 23, 2021 for Chinese Patent Application No. 202110764582.0 and English Translation.

*Primary Examiner* — Anthony Ho
(74) *Attorney, Agent, or Firm* — Ling Wu; Stephen Yang; Ling and Yang Intellectual Property

(57)          ABSTRACT
A display substrate, a preparation method thereof, and a display apparatus, the display substrate includes a base substrate; a drive circuit layer provided on the base substrate; a light-emitting structure layer provided on a side of the drive circuit layer away from the base substrate, the light-emitting structure layer includes a pixel defining layer and an organic light-emitting layer, the pixel defining layer defines multiple sub-pixel regions and includes a first opening at least partially exposing the drive circuit layer, the organic light-emitting layer is located in the sub-pixel region and is overlapped with the first opening of the pixel defining
(Continued)

layer; and a color film structure layer provided on a side of the light-emitting structure layer away from the base substrate, the color film structure layer includes a color film and a black matrix, the black matrix includes a second opening at least partially exposing the first opening.

22 Claims, 17 Drawing Sheets

(51) Int. Cl.
| | |
|---|---|
| *H10K 59/35* | (2023.01) |
| *H10K 59/38* | (2023.01) |
| *H10K 59/80* | (2023.01) |

(52) U.S. Cl.
CPC ......... *H10K 59/352* (2023.02); *H10K 59/353* (2023.02); *H10K 59/38* (2023.02); *H10K 59/8792* (2023.02)

(56) References Cited

U.S. PATENT DOCUMENTS

| | | |
|---|---|---|
| 2018/0252969 A1 | 9/2018 | Long et al. |
| 2020/0013992 A1 | 1/2020 | Cheng |
| 2022/0413347 A1 | 12/2022 | Li et al. |

FOREIGN PATENT DOCUMENTS

| | | |
|---|---|---|
| CN | 206684444 U | 11/2017 |
| CN | 207134356 U | 3/2018 |
| CN | 110534551 A | 12/2019 |
| CN | 111752052 A | 10/2020 |
| CN | 112420962 A | 2/2021 |
| CN | 212517208 U | 2/2021 |
| CN | 112786813 A | 5/2021 |
| CN | 112864205 A | 5/2021 |
| CN | 113257883 A | 8/2021 |
| EP | 4036999 A1 | 8/2022 |
| JP | 2019168588 A | 10/2019 |
| KR | 20170040180 A | 4/2017 |

DISPLAY SUBSTRATE AND PREPARATION METHOD THEREFOR, AND DISPLAY APPARATUS

CROSS-REFERENCE TO RELATED APPLICATIONS

The present application is a U.S. National Phase Entry of International Application PCT/CN2022/101807 having an international filing date of Jun. 28, 2022, which claims priority to Chinese Patent Application No. 202110764582.0 filed to the CNIPA on Jul. 7, 2021 and entitled "Display Substrate and Preparation Method Therefor, and Display Apparatus", and the contents disclosed in the above-mentioned applications are hereby incorporated as a part of this application.

TECHNICAL FIELD

Embodiments of the present disclosure relate to, but are not limited to, the field of display technology, and particularly to a display substrate, a preparation method for a display substrate, and a display apparatus.

BACKGROUND

An Organic Light Emitting Diode (OLED for short) and a Quantum dot Light Emitting Diode (QLED for short) are active light emitting display devices and have advantages, such as self-illumination, wide angle of view, high contrast ratio, low power consumption, very high response speed, lightness and thinness, bendability, and low cost. With continuous development of display technologies, a flexible display apparatus (Flexible Display) with an OLED or a QLED as a light-emitting device and a Thin Film Transistor (TFT for short) for performing signal controlling has become a mainstream product in current display field.

SUMMARY

The following is a summary of subject matters described herein in detail. The summary is not intended to limit the protection scope of claims.

An embodiment of the present disclosure provides a display substrate, the display substrate includes a base substrate; a drive circuit layer provided on the base substrate; a light-emitting structure layer provided on a side of the drive circuit layer away from the base substrate, the light-emitting structure layer includes a pixel defining layer and an organic light-emitting layer, the pixel defining layer defines multiple sub-pixel regions and includes a first opening at least partially exposing the drive circuit layer, the organic light-emitting layer is located in the sub-pixel region and overlapped with the first opening of the pixel defining layer; and a color film structure layer provided on a side of the light-emitting structure layer away from the base substrate, the color film structure layer includes a color film and a black matrix, the black matrix includes a second opening at least partially exposing the first opening, the color film is provided in the second opening, the black matrix includes a first sub-side, and the first sub-side includes a fold line structure.

In an exemplary implementation, the first sub-side includes multiple fold angles, and the farther in a region away from the center line of the sub-pixel region, the greater the quantity of the fold angles of the first sub-side is.

In an exemplary implementation, the sub-pixel region includes a center line, a first reference line, a second reference line, a third reference line, and a fourth reference line in sequence along a first direction, the fourth reference line coincides with a farthest border of the first sub-side edge on a side away from the center line, wherein: a distance between the first reference line and the center line of the sub-pixel region is k, a distance between the first reference line and the second reference line is n1, a distance between the second reference line and the third reference line is n2, and a distance between the third reference line and the fourth reference line is n3; $k+n1+n2+n3=L/2$, where L is a length of the sub-pixel region along the first direction; a quantity x of fold angles between the center line and the first reference line, a quantity y of fold angles between the first reference line and the second reference line, and a quantity z of fold angles between the second reference line and the third reference line of the first sub-side meet the following conditions: $x \leq y \leq z$.

In an exemplary implementation, $n1=n2=n3$.

In an exemplary implementation, a quantity of fold angles of the first sub-side between the center line and the first reference line $x \geq 3$; a quantity of fold angles of the first sub-side between the first reference line and the second reference line $y \geq 3$; and a quantity of fold angles of the first sub-side between the second reference line and the third reference line $z \geq 3$.

In an exemplary implementation, the first sub-side includes at least two fold angles substantially equal between the center line and the first reference line; the first sub-side edge includes at least two fold angles substantially equal between the first reference line and the second reference line; and the first sub-side edge includes at least two fold angles substantially equal between the second reference line and the third reference line.

In an exemplary implementation, the first sub-side includes at least one first fold angle between the center line and the first reference line, the first sub-side includes at least one second fold angle between the first reference line and the second reference line, the first sub-side includes at least one third fold angle between the second reference line and the third reference line, and the angles of the first fold angle, the second fold angle, and the third fold angle are substantially equal.

In an exemplary implementation, a quantity of fold angles of the first sub-side between the center line and the first reference line $x \geq 3$, a quantity of fold angles of the first sub-side between the first reference line and the second reference line $y \geq 4$, and a quantity of fold angles of the first sub-side between the second reference line and the third reference line $z \geq 5$.

In an exemplary implementation, the first sub-side includes at least three fold angles between the center line and the first reference line: x1, x2, x3, where x2 and x3 are substantially equal, and x1+x2 is substantially equal to 360 degrees; the first sub-side includes at least four fold angles between the first reference line and the second reference line: y1, y2, y3 and y4, where y1 and y2 are substantially equal, and y3+y4 is substantially equal to 360 degrees; the first sub-side includes at least four fold angles between the second reference line and the third reference line: z1, z2, z3 and z4, where z1 and z2 are substantially equal, and z3+z4 is substantially equal to 360 degrees.

In an exemplary implementation, the first sub-side includes at least three fold angles between the center line and the first reference line with substantially equal angles.

In an exemplary implementation, the angles of the at least three fold angles of the first sub-side between the center line and the first reference line are equal to n times 45 degrees, where n=3 or 5.

In an exemplary implementation, the first sub-side has a first width along a first direction; the drive circuit layer includes at least one first signal line, the first signal line has a second width along a first direction, an orthographic projection of the first signal line on the base substrate and an orthographic projection of the first sub-side on the base substrate have a first overlap, and the first overlap has a third width along the first direction.

In an exemplary implementation, an orthographic projection of the first signal line on the base substrate, an orthographic projection of the first sub-side on the base substrate, and an orthographic projection of the color film on the base substrate have a first overlap.

In an exemplary implementation, the first signal line has a fold line structure, the black matrix has multiple sub-sides, and a quantity of fold angles of the first signal line in any sub-pixel region is less than a quantity of fold angles of at least one sub-side of the black matrix and greater than a quantity of fold angles of at least one another sub-side of the black matrix.

In an exemplary implementation, the first width is $l1$, the second width is $l2$, the sub-pixel region includes a center line and a first reference line along a first direction, a distance between the first reference line and the center line of the sub-pixel region is $k$, and a length of the sub-pixel region along the first direction is $L$, then: $10*l1 \leq L \leq 10*l2$; $2*k < L \leq 3*k$.

In an exemplary implementation, the first width is $l1$, the second width is $l2$, the third width is $l3$, the sub-pixel region includes a center line and a first reference line along the first direction, a distance between the first reference line and the center line of the sub-pixel region is $k$, and a length of the sub-pixel region along the first direction is $L$, then: $6*l2 < L \leq 7*l2$; $20*l3 < L \leq 35*l3$; $3.5*l3 < l2 \leq 4*l3$.

In an exemplary implementation, an orthographic projection of the color film on the base substrate at least partially covers an orthographic projection of the first opening of the pixel defining layer on the base substrate; in a third direction, a maximum thickness of the color film is greater than a maximum thickness of the first sub-side, and the color film at least partially covers the first sub-side, and the third direction is a direction along the base substrate toward the color film structure layer.

In an exemplary implementation, the black matrix has a second thickness $l4$ in a third direction, the second thickness is between 0.9 microns and 1.2 microns, the third direction is a direction along the base substrate toward the color film structure layer.

In an exemplary implementation, the first sub-side includes a third sub-line segment that is neither parallel nor perpendicular to the first direction and the second direction, and the black matrix includes multiple third sub-line segments.

In an exemplary implementation, the first sub-side includes four discrete third sub-line segments, and the four third sub-line segments are provided at intervals one by one.

In an exemplary implementation, the first sub-side has a step structure.

In an exemplary implementation, the black matrix further includes a second sub-side provided opposite to the first sub-side, and the second sub-side has a fold line structure, the first sub-side and the second sub-side are provided asymmetrically with respect to a center line of the sub-pixel region.

In an exemplary implementation, the sub-pixel region includes an eighth reference line, a seventh reference line, a sixth reference line, a fifth reference line, a center line, a first reference line, a second reference line, a third reference line and a fourth reference line in sequence along the first direction, the fourth reference line coincides with a farthest border on a side of the first sub-side away from the center line, and the eighth reference line coincides with a farthest border on a side of the second sub-side away from the center line, wherein: a distance between the first reference line and the center line of the sub-pixel region is $k$, a distance between the fifth reference line and the center line of the sub-pixel region is $k$, a distance between the first reference line and the second reference line is $n1$, a distance between the sixth reference line and the fifth reference line is $n1$, a distance between the second reference line and the third reference line is $n2$, a distance between the seventh reference line and the sixth reference line is $n2$, a distance between the third reference line and the fourth reference line is $n3$, and a distance between the eighth reference line and the seventh reference line is $n3$; $k+n1+n2+n3=L/2$, where $L$ is a length of the sub-pixel region along the first direction; a quantity $x$ of fold angles of the first sub-side between the center line and the first reference line, a quantity $y$ of fold angles of the first sub-side between the first reference line and the second reference line, a quantity $z$ of fold angles of the first sub-side between the second reference line and the third reference line, a quantity $x'$ of fold angles of the second sub-side between the center line and the fifth reference line, a quantity of fold angles $y'$ of the second sub-side between the fifth reference line and the sixth reference line, and a quantity of fold angles $z'$ of the second sub-side between the sixth reference line and the seventh reference line satisfy the following conditions: $x=x'$, $y \neq y'$, $z \neq z'$.

In an exemplary implementation, the black matrix further includes a third sub-side and a fourth sub-side provided oppositely, the first sub-side, the third sub-side, the second sub-side, and the fourth sub-side are connected head to tail, and the third sub-side and the fourth sub-side have a straight bar shape or have a substantially straight bar shape.

In an exemplary implementation, the sub-pixel region includes a first sub-pixel region, a second sub-pixel region, and a third sub-pixel region, the first sub-pixel region includes a first light-emitting unit and a first color film, the second sub-pixel region includes a second light-emitting unit and a second color film, the third sub-pixel region includes a third light-emitting unit and a third color film, an orthographic projection of the first color film on the base substrate covers an orthographic projection of the first light-emitting unit on the base substrate, an orthographic projection of the second color film on the base substrate covers an orthographic projection of the second light-emitting unit on the base substrate, and an orthographic projection of the third color film on the base substrate covers an orthographic projection of the third light-emitting unit on the base substrate.

In an exemplary implementation, the second light-emitting unit includes two sub-light emitting units provided separately, the second color film includes two sub-color film provided separately, an orthographic projection of a sub-color film on the base substrate covers an orthographic projection of a sub-light-emitting unit on the base substrate, and an orthographic projection of the other sub-color film on the base substrate covers an orthographic projection of the other sub-light-emitting unit on the base substrate.

In an exemplary implementation, the display substrate further includes an encapsulation layer provided on a side of the color film structure layer away from the light-emitting structure layer and an orthographic projection of the encapsulation layer on the base substrate covers an orthographic projection of the color film structure layer on the base substrate.

In an exemplary implementation, the sub-pixel region includes a first sub-pixel region, a second sub-pixel region, a third sub-pixel region, and a fourth sub-pixel region, the first sub-pixel region includes a first light-emitting unit and a first color film, the second sub-pixel region includes a second light-emitting unit and a second color film, the third sub-pixel region includes a third light-emitting unit and a third color film, the fourth sub-pixel region includes a fourth light-emitting unit and a fourth color film, an orthographic projection of the first color film on the base substrate covers an orthographic projection of the first light-emitting unit on the base substrate, an orthographic projection of the second color film on the base substrate covers an orthographic projection of the second light-emitting unit on the base substrate, an orthographic projection of the third color film on the base substrate covers an orthographic projection of the third light-emitting unit on the base substrate, and an orthographic projection of the fourth color film on the base substrate covers an orthographic projection of the fourth light-emitting unit on the base substrate.

In an exemplary implementation, the display substrate further includes an encapsulation layer covering the color film structure layer, the encapsulation layer covers the first color color film, the second color color film, and the third color color film, and the fourth color color film is provided in a same layer and a same material as at least part of the encapsulation layer.

In an exemplary implementation, the first sub-pixel region is a red sub-pixel region, the second sub-pixel region is a green sub-pixel region, the third sub-pixel region is a blue sub-pixel region, and the fourth sub-pixel region is a white sub-pixel region.

In an exemplary implementation, a first sub-side of the white sub-pixel region is connected with a first sub-side of the red sub-pixel region, and a morphology of the first sub-side of the white sub-pixel region is different from a morphology of the first sub-side of the red sub-pixel region.

In an exemplary implementation, the black matrix further includes a second sub-side provided opposite to the first sub-side, the second sub-side of the green sub-pixel region is adjacent to the second sub-side of the blue sub-pixel region, and a quantity of fold angles of the second sub-side of the green sub-pixel region is greater than a quantity of fold angles of the second sub-side of the blue sub-pixel region.

In an exemplary implementation, the black matrix between two adjacent sub-pixel regions is conformal.

In an exemplary implementation, a quantity of fold angles of the black matrix between the white sub-pixel region and the green sub-pixel region is greater than a quantity of fold angles of the black matrix between the red sub-pixel region and the blue sub-pixel region.

In an exemplary implementation, the sub-pixel regions of different colors have different areas.

In an exemplary implementation, the display substrate further includes a blank structure and an orthographic projection of the blank structure on the base substrate is not overlapped with an orthographic projection of the sub-pixel region on the base substrate.

In an exemplary implementation, a ratio of an area of the blank structure to an area of the sub-pixel region is greater than or equal to 45%.

In an exemplary implementation, the ratio of the area of the blank structure to the area of the sub-pixel region is equal to 46%.

In an exemplary implementation, the blank structure has a fifth width along a first direction and the fifth width is equal or substantially equal to a total length of all fold line structures of the first sub-side.

In an exemplary implementation, the multiple sub-pixel regions include a white sub-pixel region and a red sub-pixel region, the blank structure has a first sub-edge adjacent to a first sub-side of the white sub-pixel region and a first sub-side of the red sub-pixel region, a shape of the first sub-edge is conformal with a shape of the first sub-side of the white sub-pixel region and the first sub-side of the red sub-pixel region.

In an exemplary implementation, the drive circuit layer further includes a repairing structure and an orthographic projection of the repairing structure on the base substrate is at least partially overlapped with an orthographic projection of the blank structure on the base substrate.

In an exemplary implementation, the multiple sub-pixel regions include a red sub-pixel region and a blue sub-pixel region, and the repairing structure of the red sub-pixel region and the repairing structure of the blue sub-pixel region are at least partially symmetrical and at least partially asymmetrical.

In an exemplary implementation, the light-emitting structure layer further includes an anode, the first opening at least partially exposes the anode, and at least one sub-pixel region includes multiple sub-anode blocks provided separately.

In an exemplary implementation, the multiple discrete sub-anode blocks includes two.

In an exemplary implementation, the two sub-anode blocks have different morphologies.

In an exemplary implementation, the drive circuit layer includes anode holes and the anode holes are electrically connected with the two sub-anode blocks, respectively.

In an exemplary implementation, the drive circuit layer further includes a repairing structure and the two sub-anode blocks electrically connected with each other and electrically connected with the repairing structure.

An embodiment of the present disclosure also provides a display apparatus and the display apparatus includes an aforementioned display substrate.

An embodiment of the present disclosure also provides a preparation method of a display substrate and the preparation method includes:

forming a drive circuit layer on a base substrate;

forming a light-emitting structure layer on a side of the drive circuit layer away from the base substrate, wherein the light-emitting structure layer includes a pixel defining layer and an organic light-emitting layer, the pixel defining layer defines multiple sub-pixel regions and includes a first opening at least partially exposing the drive circuit layer, and the organic light-emitting layer is located in the sub-pixel region and is overlapped with the first opening of the pixel defining layer;

forming a color film structure layer on a side of the light-emitting structure layer away from the base substrate, wherein the color film structure layer includes a color film and a black matrix, the black matrix includes a second opening at least partially exposing the first opening, the color film is provided in the second opening, the black matrix includes a first sub-side, and the first sub-side includes a fold line structure.

Other aspects may be comprehended upon reading and understanding of the drawings and detailed descriptions.

BRIEF DESCRIPTION OF DRAWINGS

The accompanying drawings are used for providing understanding of technical solutions of the present disclosure, and form a part of the specification. They are used for explaining the technical solutions of the present disclosure together with embodiments of the present disclosure, but do not form a limitation on the technical solutions of the present disclosure.

DETAILED DESCRIPTION

Figures 1, 2:
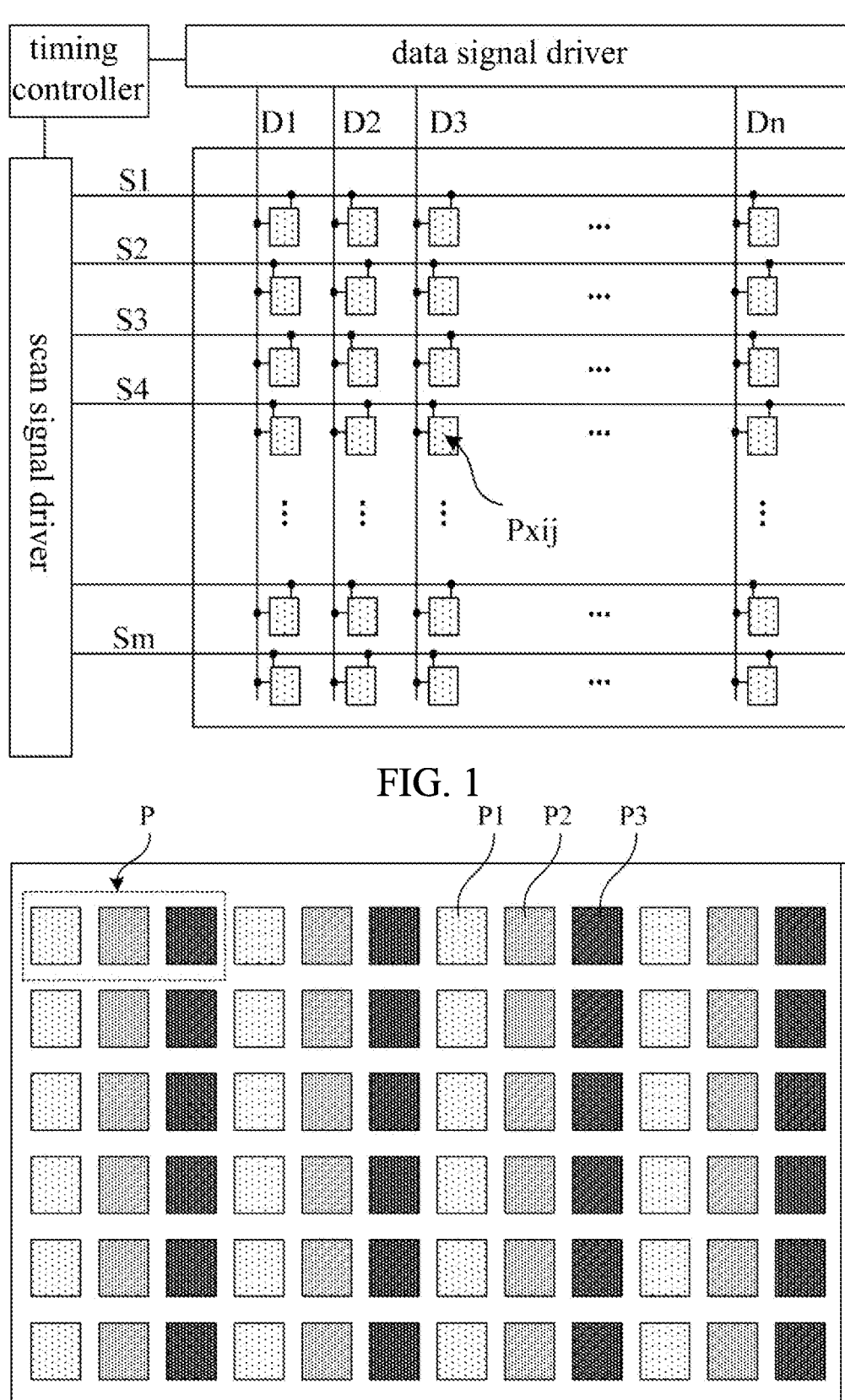
FIG. 1 is a schematic view of a structure of a display apparatus according to an exemplary embodiment of the present disclosure.
FIG. 2 to FIG. 5 are schematic views of a pixel array of four display substrates according to an exemplary embodiment of the present disclosure.

To make objectives, technical solutions, and advantages of the present disclosure clearer, embodiments of the present disclosure will be described in detail with reference to the accompanying drawings. It is to be noted that implementations may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other without conflict.

In the drawings, a size of each constituent element, a thickness of a layer, or a region is exaggerated sometimes for clarity. Therefore, one implementation of the present disclosure is not necessarily limited to the sizes, and shapes and sizes of various components in the drawings do not reflect actual scales. In addition, the drawings schematically illustrate ideal examples, and one implementation of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, or a detachable connection, or an integrated connection. It may be a mechanical connection or an electrical connection. It may be a direct mutual connection, or an indirect connection through a middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, the fact that two angles are substantially equal means that a ratio between the two angles is in the range of 0.9 or more and 1.1 or less, and thus also includes a range in which a ratio between the two angles is in the range of 0.95 or more and 1.05 or less. Thus, the fact that a sum of two angles is approximately equal to 360° may include a range in which the sum of the two angles is equal to above 342° and below 378°.

In the specification, a "film" and a "layer" are interchangeable. For example, a "conductive layer" may be replaced with a "conductive film" sometimes. Similarly, an "insulation film" may be replaced with an "insulation layer" sometimes.

In the present disclosure, "about" refers to that a boundary is defined not so strictly and numerical values within process and measurement error ranges are allowed. FIG. 1 is a schematic view of a structure of a display apparatus according to an exemplary embodiment of the present disclosure. As shown in FIG. 1, the display apparatus may include a timing controller, a data signal driver, a scan signal driver, and a pixel array. The pixel array may include multiple scan signal lines (S1 to Sm), multiple data signal lines (D1 to Dn), and multiple sub-pixels Pxij. In an exemplary implementation, the timing controller may provide a gray scale value and a control signal suitable for the specification of the data signal driver to the data signal driver, and may provide a clock signal, a scan start signal, and the like suitable for the specification of the scan signal driver to the scan signal driver. The data signal driver may generate a data voltage to be provided to the data signal lines D1, D2, D3, . . . , and Dn by using the gray scale value and the control signal that are received from the timing controller. For example, the data signal driver may sample the gray scale value using the clock signal and apply a data voltage corresponding to the gray scale value to the data signal lines D1 to Dn taking a sub-pixel row as a unit, wherein n may be a natural number. The scan signal driver may receive the clock signal, the scan start signal, etc., from the timing controller to generate a scan signal to be provided to the scan signal lines S1, S2, S3, . . . , and Sm. For example, the scan signal driver may sequentially provide a scan signal with an on-level pulse to the scan signal lines S1 to Sm. For example, the scan signal driver may be constructed in a form of a shift register and may generate a scan signal in a manner in which the scan start signal provided in a form of an on-level pulse is transmitted to a next-stage circuit sequentially under the control of the clock signal, wherein m may be a natural number. An array of sub-pixels may include the multiple sub-pixels Pxij. Each sub-pixel Pxij may be connected to a corresponding data signal line and a corresponding scan signal line, wherein i and j may be natural numbers. The sub-pixel Pxij may refer to a sub-pixel in which a transistor is connected to an i-th scan signal line and connected to a j-th data signal line.

Figure 3:
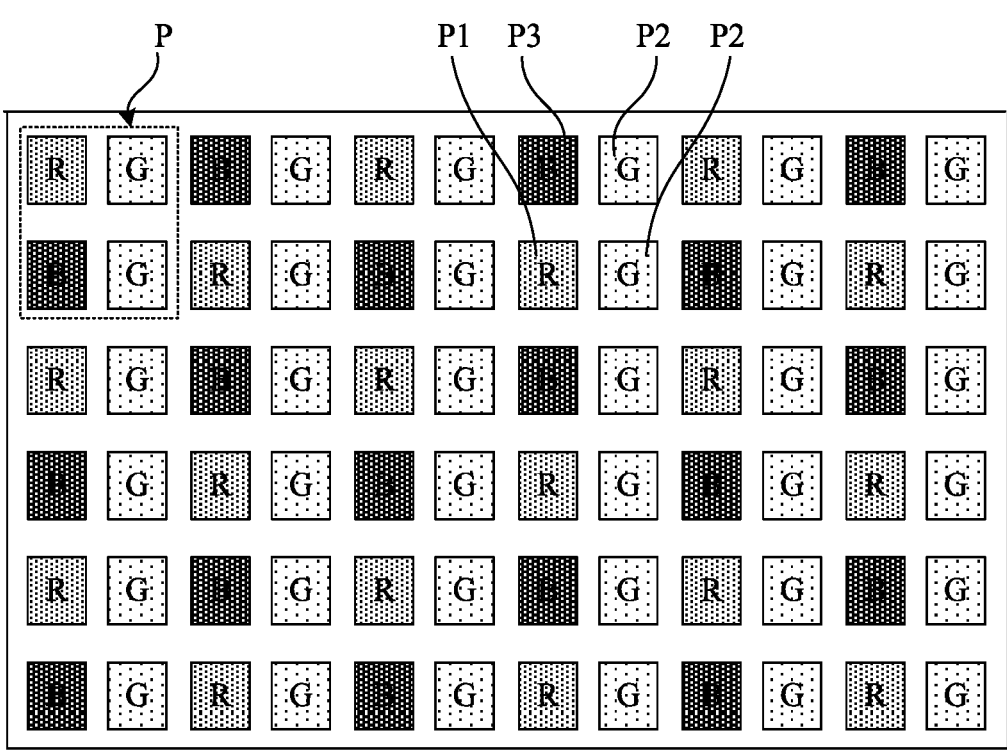
Figure 4:
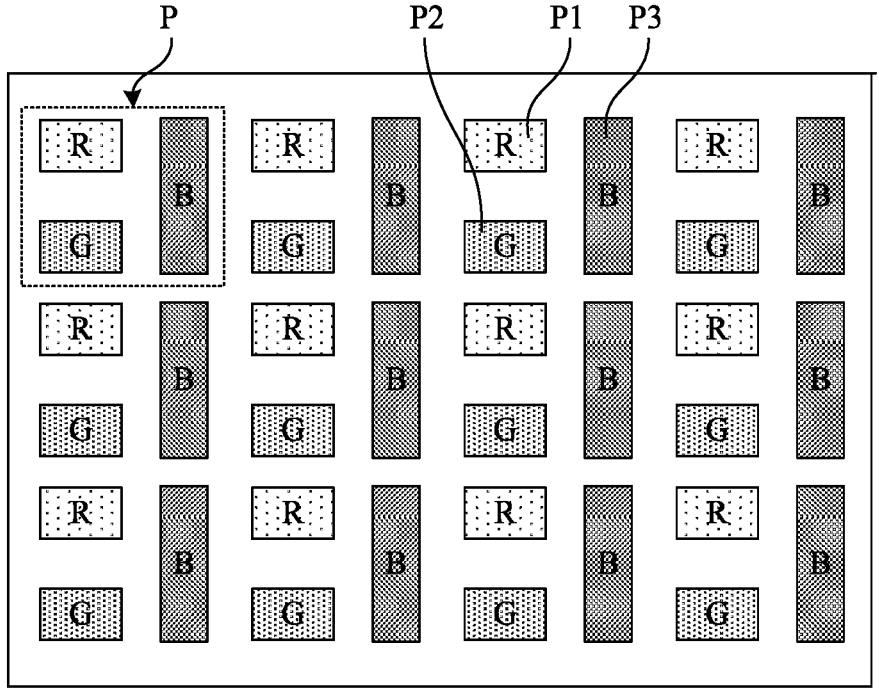

FIG. 2 to FIG. 4 are schematic views of a planar structure of three display substrates according to an embodiment of the present disclosure. As shown in FIG. 2 to FIG. 4, a display substrate may include multiple pixel units P provided in a matrix manner. At least one of the multiple pixel units P includes a first light-emitting unit (sub-pixel) P1 that emits light of a first color, a second light-emitting unit P2 that emits light of a second color and a third light-emitting unit P3 that emits light of a third color. Each of the first light-emitting unit P1, the second light-emitting unit P2, and the third light-emitting unit P3 includes a pixel drive circuit and a light-emitting device. Pixel drive circuits in the first light-emitting unit P1, the second light-emitting unit P2, and the third light-emitting unit P3 are respectively connected with a scan signal line, a data signal line, and a light-emitting signal line. A pixel drive circuit is configured to receive a data voltage transmitted by a data signal line and output a corresponding current to a light-emitting device under control of a scan signal line and a light-emitting signal line. Light-emitting devices in the first light-emitting unit P1, the second light-emitting unit P2, and the third light-emitting unit P3 are respectively connected with pixel drive circuits of light-emitting units where the light-emitting devices are located, and a light-emitting device is configured to emit light of corresponding brightness in response to a current output by a pixel drive circuit of a light-emitting unit where the light-emitting device is located.

In an exemplary implementation, the first light-emitting unit may be a red (R) light-emitting unit, the second light-emitting unit may be a green (G) light-emitting unit, and the third light-emitting unit may be a blue (B) light-emitting unit. The present disclosure is not limited herein.

Figure 5:
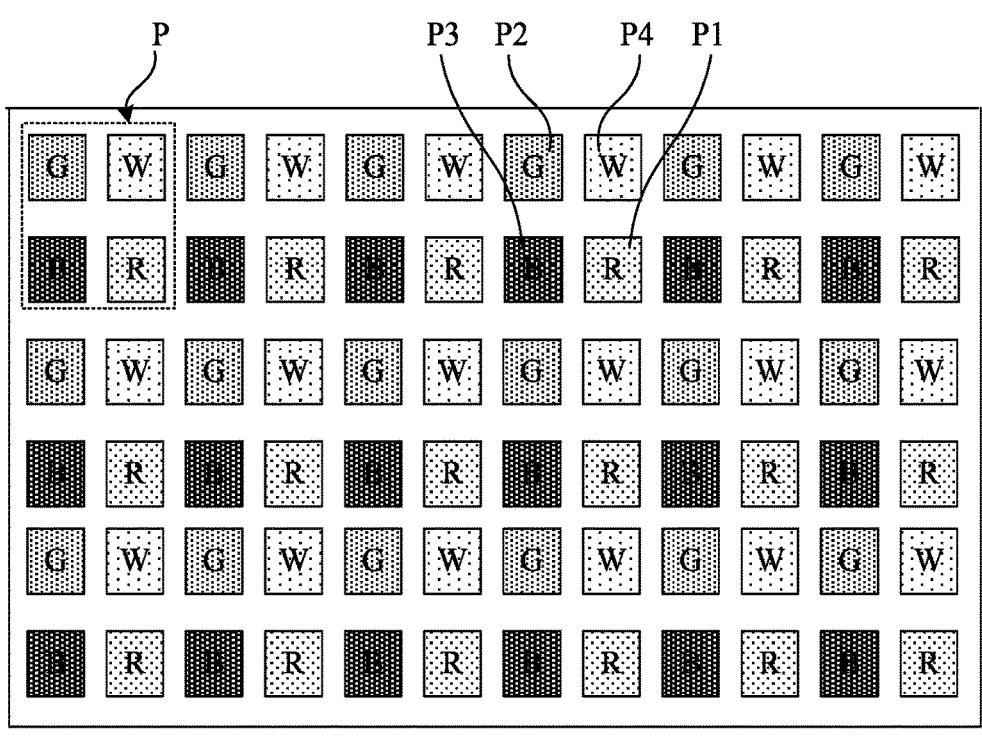

In an exemplary implementation, as shown in FIG. 5, at least one of the multiple pixel units P further includes a fourth light-emitting unit P4 that emits light of a fourth color, and the exemplary fourth light-emitting unit P4 may be a white (W) light-emitting unit, which is not limited herein. The fourth light-emitting unit P4 may include a pixel drive circuit and a light-emitting device. The pixel drive circuit in the fourth light-emitting unit P4 is connected with a scan signal line, a data signal line, and a light-emitting signal line respectively. The pixel drive circuit is configured to receive a data voltage transmitted by the data signal line and output a corresponding current to the light-emitting device under control of the scan signal line and the light-emitting signal line. A light-emitting device in the fourth light-emitting unit P4 is connected with a pixel drive circuit in the fourth light-emitting unit P4, and a light-emitting device is configured to emit light of corresponding brightness in response to a current output by a pixel drive circuit of a light-emitting unit where the light-emitting device is located.

In an exemplary implementation, a shape of a light-emitting unit in a pixel unit may be a rectangle, a rhombus, a pentagon, or a hexagon. When the pixel unit includes three light-emitting units, the three light-emitting units may be arranged in a manner to stand side by side horizontally, in a manner to stand side by side vertically, or in a triangle manner like a Chinese character " 品 ". When the pixel unit includes four light-emitting units, the four light-emitting units may be arranged in a manner to stand side by side horizontally, in a manner to stand side by side vertically, or in a manner to form a Square, which is not limited in the present disclosure.

With the continuous development of display technology, OLED technology is increasingly applied in transparent display. Transparent display is an important personalized display field of the display technology, refers to display of images in a transparent state, in which a viewer can see not only images in a display apparatus, but also scenes behind the display apparatus, and Virtual Reality (VR) and Augmented Reality (AR) and 3D display functions can be implemented. In a transparent display apparatus using AMOLED technology, each pixel is generally divided into a display area and a transparent area. The display area provides pixel driving circuits and light-emitting elements to implement image display, and the transparent area implements light transmission.

Any display apparatus over 27 inches can be called a large screen display apparatus. In a large-size transparent display product, when external light passes through the gap between two adjacent pixel columns, there will be strong diffraction, interference and scattering color separation effects, which will lead to poor display effect of a large-size transparent display panel.

An exemplary embodiment of the present disclosure provides a display substrate, the display substrate may include a base substrate, a drive circuit layer provided on the base substrate; a light-emitting structure layer provided on a side of the drive circuit layer away from the base substrate, the light-emitting structure layer includes a pixel defining layer and an organic light-emitting layer, wherein the pixel defining layer defines multiple sub-pixel regions and has a first opening at least partially exposing the drive circuit layer, the organic light-emitting layer is located in the sub-pixel region and overlapped with the first opening of the pixel defining layer; and a color film structure layer provided on a side of the light-emitting structure layer away from the base substrate, the color film structure layer includes a color film and a black matrix, the black matrix of at least one sub-pixel region has a second opening at least partially exposing the first opening, the color film is provided in the second opening, the black matrix of at least one sub-pixel region has at least one side, and the at least one side has a fold line structure.

In an embodiment of the present disclosure, the display substrate reduces reflectivity and improves light-emission purity, by disposing a color film and a black matrix on the color film structure layer, and the black matrix has sides of a fold line structure, the display substrate of an embodiment of the present disclosure does not need to use a polarizer, so that a cost of the display substrate is reduced, a thickness of the display substrate is reduced, bendability of the display substrate is improved, and grating effect, such as diffraction effect, interference effect and scattering color separation, is reduced, and the display effect is improved.

Figure 6:
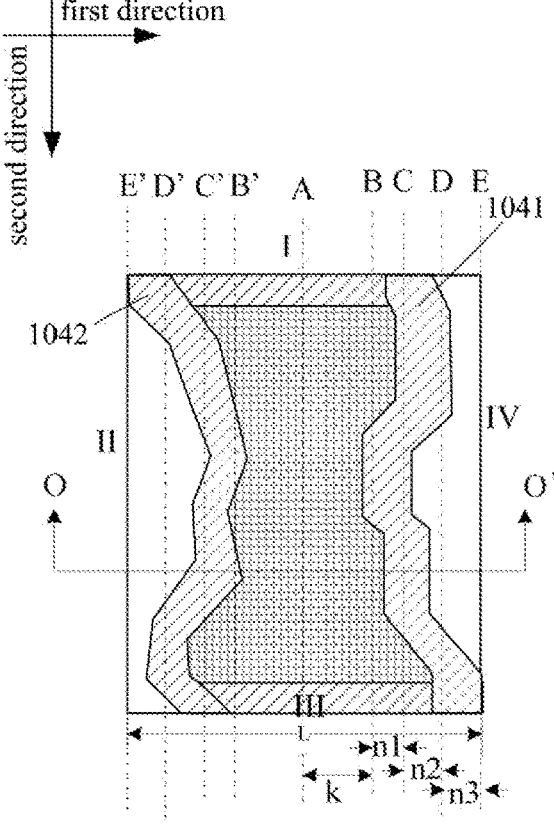
FIG. 6 is a schematic view of a structure of a sub-pixel according to an exemplary embodiment of the present disclosure.
Figure 7:
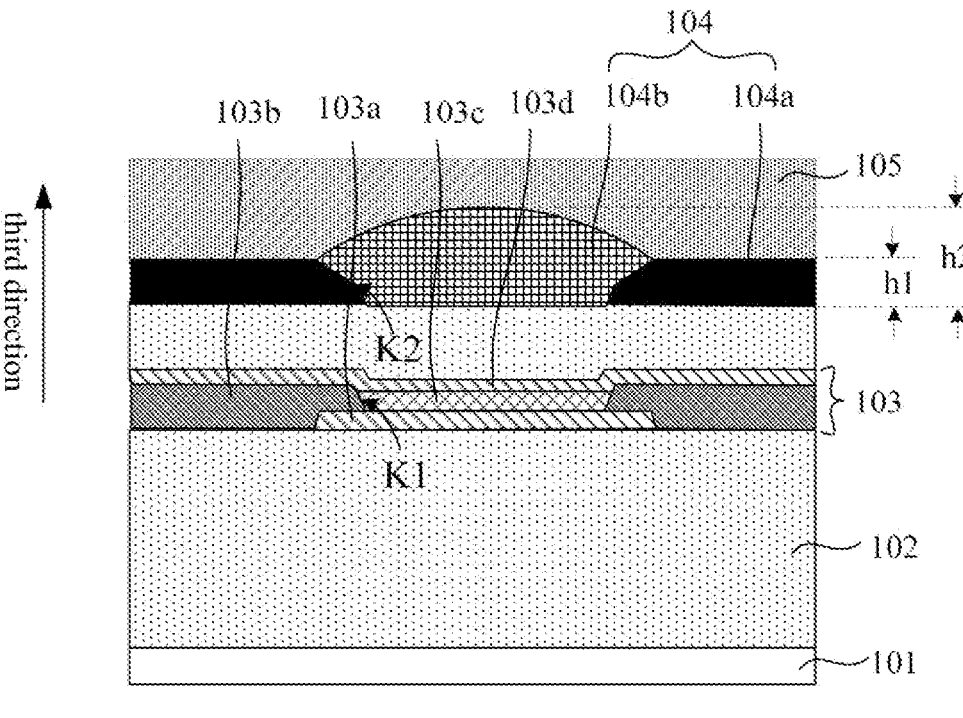
FIG. 7 is a schematic cross-sectional view of a structure of an area OO' in FIG. 6.

FIG. 6 is a schematic view of a structure of a sub-pixel according to an exemplary embodiment of the present disclosure, and FIG. 7 is a schematic cross-sectional view of a structure of a region OO' in FIG. 6, illustrating a structure of a sub-pixel, as shown in FIG. 6 and FIG. 7, an exemplary embodiment of the present disclosure provides a display substrate, including:

a base substrate 101;

a drive circuit layer 102 provided on the base substrate 101;

a light-emitting structure layer 103 provided on a side of the drive circuit layer 102 away from the base substrate 101, wherein the light-emitting structure layer 103 includes a pixel defining layer 103*b* and an organic light-emitting layer 103*c*, the pixel defining layer 103*b* defines multiple sub-pixel regions, and includes a first opening K1 at least partially exposing the drive circuit layer 102, the organic light-emitting layer 103*c* is located in the sub-pixel region and overlapped with the first opening K1 of the pixel defining layer 103*b*; and a color film structure layer 104 provided on a side of the light-emitting structure layer 103 away from the base substrate 101, wherein the color film structure layer 104 includes a color film 104*b* and a black matrix 104*a*, the black matrix includes a second opening K2 at least partially exposing the first opening K1, and the black matrix 104*a* is provided in the second opening K2, the black matrix 104*a* includes a first sub-side 1041, and the first sub-side 1041 includes a fold line structure.

In an exemplary implementation, the display substrate further includes an encapsulation layer 105 provided on a side of the light-emitting structure layer away from the base substrate. In some possible implementations, the display substrate may include another film layer, such as post spacer, which is not limited in the present disclosure.

Figure 8:
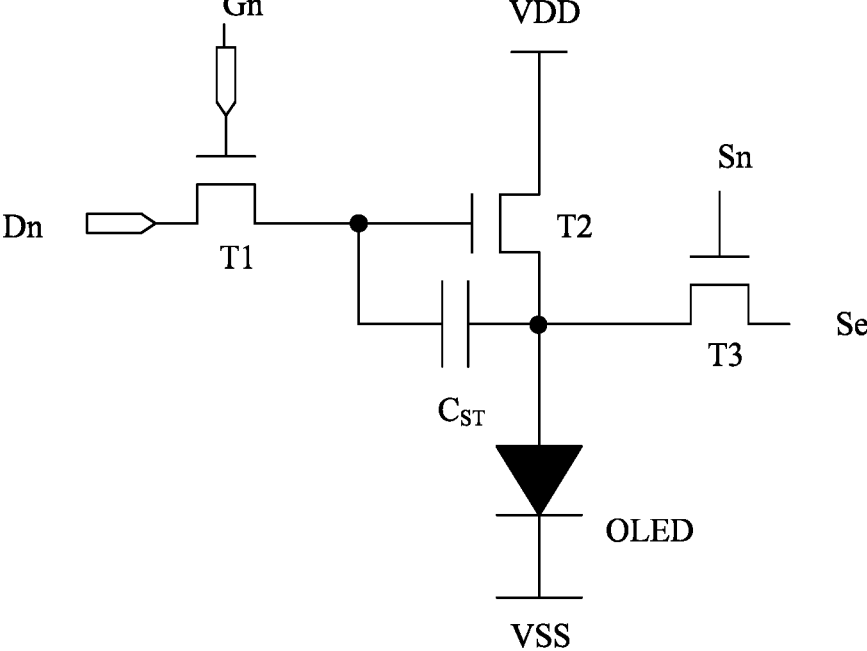
FIG. 8 is a schematic view of a structure of a pixel drive circuit of a display substrate according to an exemplary embodiment of the present disclosure.

In an exemplary implementation, the base substrate may be a flexible base substrate or a rigid base substrate. The drive circuit layer 102 of each sub-pixel may include multiple transistors and storage capacitors forming a pixel drive circuit. In an exemplary implementation, the pixel drive circuit may be of a structure of 3T1C, 4T1C, 5T1C, 5T2C, 6T1C, or 7T1C. FIG. 8 is a schematic view of an equivalent circuit of a pixel drive circuit. As shown in FIG. 8, the pixel drive circuit has a 3T1C structure, which may include three transistors (a first transistor T1, a second transistor T2, and a third transistor T3), one storage capacitor CST, and six signal lines (a data signal line Dn, a first scan signal line Gn, a second scan signal line Sn, a compensation line Se, a first power supply line VDD, and a second power supply line VSS). In an exemplary implementation, the first transistor T1 is a switching transistor, the second transistor T2 is a drive transistor, and the third transistor T3 is a compensation transistor. A gate electrode of the first transistor T1 is coupled to the first scan signal line Gn, a first electrode of the first transistor T1 is coupled to the data signal line Dn, a second electrode of the first transistor T1 is coupled to a gate electrode of the second transistor T2. The first transistor T1 is configured to receive a data signal transmitted by the data signal line Dn under control of the first scan signal line Gn, so that the gate electrode of the second transistor T2 receives the data signal. A gate electrode of the second transistor T2 is coupled to the second electrode of the first transistor T1, a first electrode of the second transistor T2 is coupled to the first power supply line VDD, a second electrode of the second transistor T2 is coupled to a first electrode of an OLED, and the second transistor T2 is configured to generate a corresponding current at the second electrode under the control of the data signal received by the gate electrode of the second transistor. A gate electrode of the third transistor T3 is coupled to the second scan signal line Sn, a first electrode of the third transistor T3 is connected to the compensation line Se, a second electrode of the third transistor T3 is coupled to the second electrode of the second transistor T2. The third transistor T3 is configured to extract a threshold voltage Vth and a mobility of the second transistor T2 in response to compensation timing to compensate the threshold voltage Vth. The first electrode of the OLED is coupled to the second electrode of the second transistor T2, a second electrode of the OLED is coupled to the second power supply line VSS, and the OLED is configured to emit light with corresponding brightness in response to the current of the second electrode of the second transistor T2. A first electrode of the storage capacitor CST is coupled to the gate electrode of the second transistor T2, a second electrode of the storage capacitor CST is coupled to the second electrode of the second transistor T2, and the storage capacitor CST is configured to store a potential of the gate electrode of the second transistor T2.

In an exemplary implementation, a signal of the first power supply line VDD is a high-level signal continuously provided, and a signal of the second power supply line VSS is a low-level signal continuously provided. The first transistor T1 to the third transistor T3 may be P-type transistors or may be N-type transistors. Use of a same type of transistors in a pixel drive circuit may simplify a process flow, reduce process difficulties of a display panel, and improve a product yield. In some possible implementations, the first transistor T1 to the third transistor T3 may include a P-type transistor and an N-type transistor. In an exemplary implementation, the light-emitting device may be an organic light-emitting diode (OLED), including a first electrode (anode), an organic light-emitting layer, and a second electrode (cathode) that are stacked.

In an exemplary embodiment, the light-emitting structure layer 103 may include an anode 103a, a pixel defining layer 103b, an organic light-emitting layer 103c, and a cathode 103d, the pixel defining layer 103b defines multiple sub-pixel regions, and includes a first opening K1 at least partially exposing the drive circuit layer 102, an anode 103a is connected to a drain electrode of a transistor in the drive circuit layer 102 through a via, an organic light-emitting layer 103c is connected to the anode 103a, and a cathode 103d is connected to the organic light-emitting layer 103c, and the organic light-emitting layer 103c emits light rays of corresponding colors driven by the anode 103a and the cathode 103d. The color film structure layer 104 may include a black matrix 104a and a color film 104b, the black matrix includes a second opening K2 at least partially exposing the first opening K1 and the color film 104b provided in the second opening K2. The encapsulation layer 105 may include a first encapsulation layer and a second encapsulation layer that are stacked. The first encapsulation layer may be made of an organic material, the second encapsulation layer may be made of an inorganic material, which may ensure that external water vapor cannot enter the light-emitting structure layer and the color film structure layer.

Figure 9:
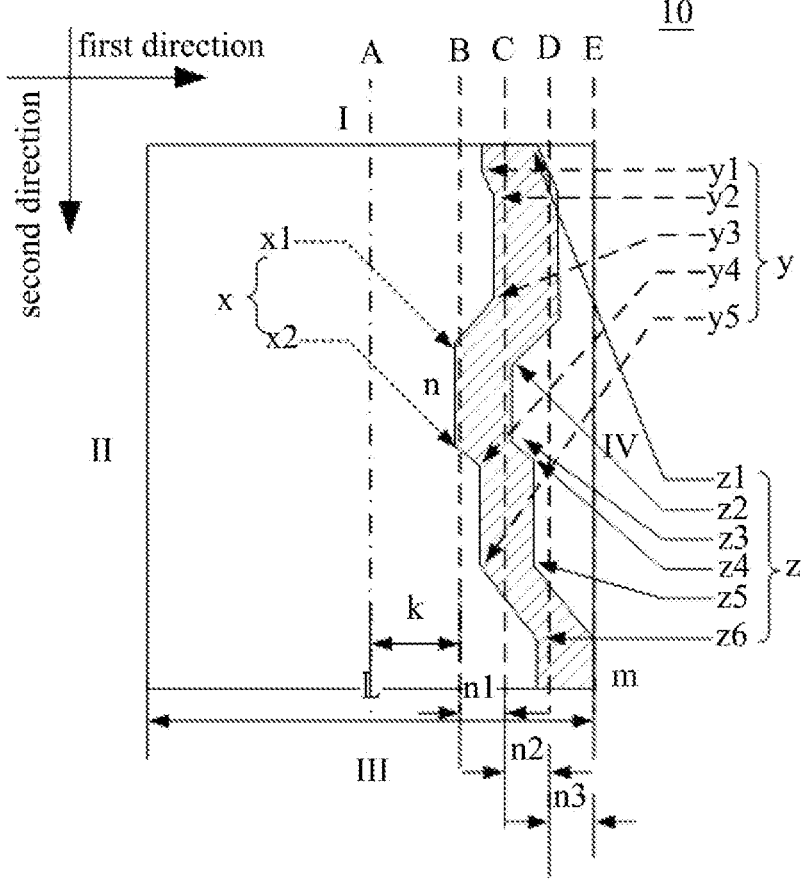
FIG. 9 is a schematic view of a structure of a first sub-side of a black matrix in a sub-pixel according to an exemplary embodiment of the present disclosure.

FIG. 9 is a schematic view of a structure of a first sub-side in a black matrix of a sub-pixel region according to an exemplary embodiment of the present disclosure. In an exemplary implementation as shown in FIG. 6 and FIG. 9, in a sub-pixel region, the black matrix includes a first sub-side 1041, the first sub-side 1041 has a certain width along a first direction and includes a fold line structure, the fold line structure includes multiple fold angles, the further in a region away from the center line A of the sub-pixel region, the greater the quantity of fold angles is.

In the display substrate of an embodiment of the present disclosure, by disposing a fold line structure of the first sub-side 1041 of the black matrix, the further away from the center line A of the sub-pixel region, the greater the quantity of fold angles in an area, further reducing diffraction effect and interference effect of the display panel, and improving the display effect.

As shown in FIG. 6, the sub-pixel region includes a sub-side I and a sub-side III provided along the first direction and a sub-side II and a sub-side IV provided along the second direction, with the sub-side I, the sub-side II, the sub-side III and the sub-side IV connected head to tail. In an embodiment of the present disclosure, the sub-side is defined as an outer contour of sub-pixel regions (outer contours, i.e., edges away from a center of a sub-pixel region), illustratively, if an outer contour of a black matrix is the outermost contour of the sub-pixel region in a certain direction, then the sub-side of the sub-pixel is the outer contour of the black matrix in that direction; if the outer contour of the pixel defining layer is the outermost contour of the sub-pixel region in a certain direction, then the sub-side of the sub-pixel is the outer contour of the pixel defining layer in that direction.

In an exemplary implementation, the sub-pixel region has a center line A, the center line A may be defined as the center line of two oppositely provided sub-sides, and in an exemplary embodiment, if one or two of the oppositely provided sub-sides have fold line segments, the center line of two fold line segments farthest from each other of the two oppositely provided sub-sides are selected as the center line of the sub-pixel region. Exemplary, as shown in FIG. 6, the two oppositely provided sub-sides may be the sub-side I and the sub-side III, or may be the sub-side II and the sub-side IV. Hereinafter, taking two opposite sub-sides are described as the sub-side II and the sub-side IV as an example for illustration.

In an exemplary implementation, a length of the sub-pixel region along the first direction is L, as shown in FIG. 6, and the length L of the sub-pixel region along the first direction may be defined as a farthest distance between two edges of the sub-pixel region that are oppositely provided along the first direction, that is, the distance between the leftmost edge of the sub-pixel region to the rightmost edge of the sub-pixel region. A first reference line B can be provided at a distance k from the center line A, and the distance k between the center line A and the first reference line B is a length of the shortest line segment between the center line A and the first reference line B. In this embodiment, since the center line A is parallel to the first reference line B, the distance k between the center line A and the first reference line B is a length of a line segment between the center line A and the first reference line B and perpendicular to the center line A and the first reference line B. The sub-pixel region may also include a second reference line C, a third reference line D, and a fourth reference line E. Where the sub-side IV has a sub-boundary m farthest from the center line A (if the sub-side IV is a straight line, the sub-boundary m is the sub-side IV). The fourth reference line E is overlapped with the sub-boundary m. In other words, an orthographic projection of the fourth reference line E on the base substrate is overlapped with an orthographic projection of the sub-boundary m of the sub-pixel 10 farthest from the center line on a certain sub-side on the base substrate. A distance between the first reference line B and the second reference line C, a distance between the second reference line C and the third reference line D, and a distance between the third reference line D and the fourth reference line E are the same, as shown in FIG. 6 or FIG. 9, the distance between the first reference line B and the second reference line C is n1, the distance between the second reference line C and the third reference line D is n2, and the distance between the third reference line D and the fourth reference line E is n3, in an exemplary implementation, n1=n2=n3; k+n1+n2+n3=L/2. In this embodiment, the center line A, the first reference line B, the second reference line C, the third reference line D, and the fourth reference line E all extend along the second direction.

In an exemplary implementation, within a sub-pixel region the black matrix 104a has at least one first sub-side 1041, and the first sub-side has a certain width along the first direction. The first sub-side 1041 has multiple fold angles. The quantity of fold angles x between the center line A and the first reference line B, the quantity of fold angles y between the first reference line B and the second reference line C, and the quantity of fold angles z between the second reference line C and the third reference line D of the first sub-side 1041 satisfy following conditions: x≤y≤z.

In this embodiment, within a range where the vertical distance from the center line A is less than or equal to k (i.e., between the center line A and the first reference line B), the first sub-side 1041 includes a quantity of fold angles x; the fold angle described in an embodiment of the present disclosure refers to an angle less than 360° and not equal to 180° toward a side of the center line A. The first sub-side 1041 includes a quantity of fold angles y in the range of a vertical distance from the center line between k and (k+(L/2−k)/3) (i.e., between the first reference line B and the second reference line C); the first sub-side 1041 includes a quantity of fold angles z in a range between (k+(L/2−k)/3) and (k+2 (L/2−k)/3) perpendicular to the center line (i.e., between the second reference line C and the third reference line D); where x, y and z satisfy the following conditions: x≤y≤z.

In another exemplary embodiment, the fold angle is also not equal to 90°, that is, the fold angle refers to a angle less than 360° and not equal to 180° or 90° toward a side of the center line A.

In another exemplary embodiment, the fold angle is an obtuse angle, that is, an angle less than 360° and greater than 90°, not equal to 180°, toward a side of the center line A.

In another exemplary embodiment, the quantity of angles x between the center line A and the first reference line B, the quantity of angles y between the first reference line B and the second reference line C, and the quantity of angles z between the second reference line C and the third reference line D of the first sub-side 1041 satisfy the following conditions: x≥3, y≥3, and z≥3.

In an exemplary implementation, the first sub-side 1041 includes at least three fold angles in a range of a vertical distance from the center line A that is less than or equal to k and at least two of the at least three fold angles are substantially equal;

the first sub-side 1041 includes at least three fold angles in a range of a vertical distance from the center line A that is from k to (k+(L/2−k)/3) and at least two of the at least three fold angles are substantially equal;

the first sub-side 1041 includes at least three fold angles in a range of a vertical distance from the center line A that is from (k+(L/2−k)/3) to (k+2(L/2−k)/3) and at least two of the at least three fold angles are substantially equal.

Figure 10:
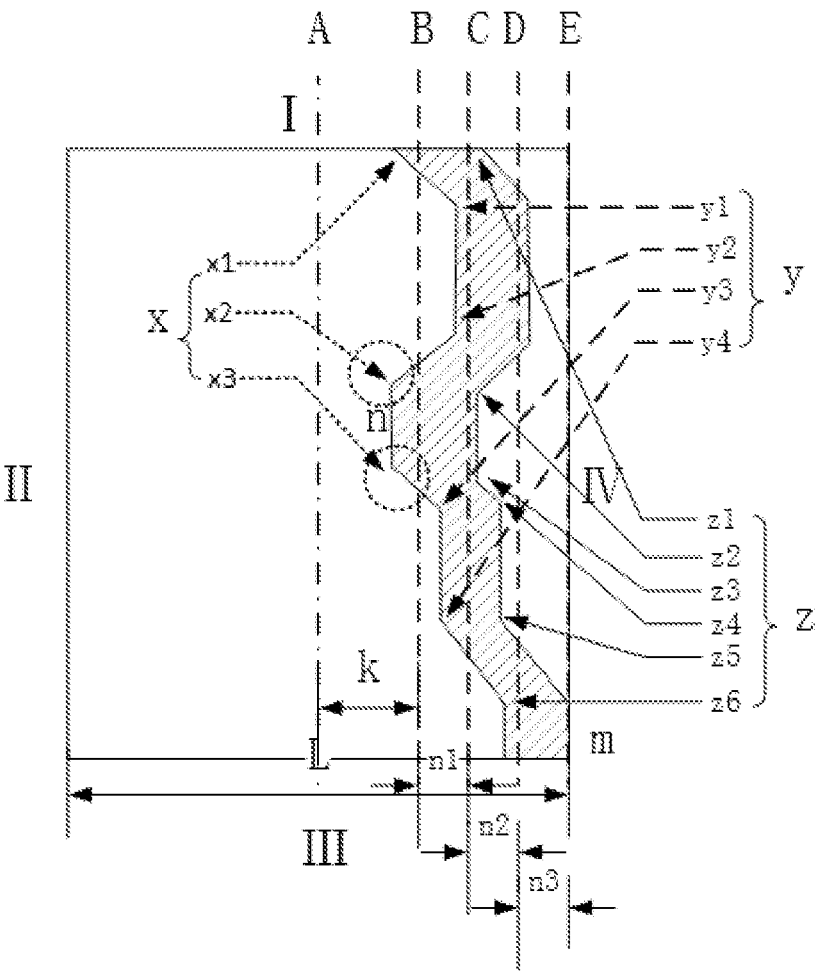
FIG. 10 is a schematic view of a structure of a first sub-side of a black matrix in another sub-pixel according to an exemplary embodiment of the present disclosure.

Exemplary, as shown in FIG. 10, the first sub-side 1041 includes at least three fold angles, x1, x2, x3, in a range where a vertical distance from the center line A is less than or equal to k (i.e., between the center line A and the first reference line B), and two fold angles of the at least three fold angles are substantially equal in angle, and, exemplary, x2 and x3 are substantially equal. The first sub-side 1041 includes at least three fold angles, y1, y2, y3, in a range where a vertical distance from the center line A is from k to (k+(L/2−k)/3) (i.e., between the first reference line B and the second reference line C), and two fold angles of the at least three fold angles are substantially equal in angle, and, exemplary, y2 and y3 are substantially equal. The first sub-side 1041 includes at least three fold angles, z1, z2 and z3, in a range where a vertical distance from the center line A is from (k+(L/2−k)/3) to (k+2(L/2−k)/3) (i.e., between the second reference line C and the third reference line D), and two fold angles of the at least three fold angles are substantially equal in angle, and, exemplary, z1 and z4 are substantially equal.

In another exemplary embodiment, the first sub-side 1041 has at least a first folding angle in a range where a vertical distance from the center line A is less than or equal to k; the first sub-side 1041 has at least a second folding angle in a range where a vertical distance from the center line A that is from k to (k+(L/2−k)/3); the first sub-side 1041 has at least a third folding angle in a range where a vertical distance from the center line A is from (k+(L/2−k)/3) to (k+2(L/2−k)/3), wherein the angles of the first folding angle, the second folding angle, and the third folding angle are substantially equal.

Exemplary, as shown in FIG. 10, the first sub-side 1041 has a first folding angle x1=135° in a range where a vertical distance from the center line A is less than or equal to k; the first sub-side 1041 has a second folding angle y1=135° in a range where a vertical distance from the center line A is from k to (k+(L/2−k)/3); the first sub-side 1041 has a third folding angle z1=135° in a range where a vertical distance from the center line A is from (k+(L/2−k)/3) to (k+2(L/2−k)/3). An embodiment of the present disclosure makes angles of some fold angles in the black matrix approximately equal, which is more beneficial to the realization of the process.

In another exemplary embodiment, a quantity of fold angles x between the center line A and the first reference line B, a quantity of fold angles y between the first reference line B and the second reference line C, and a quantity of fold angles z between the second reference line C and the third reference line D of the first sub-side 1041 satisfy the following conditions: x≥3, y≥4, and z≥5.

Exemplary as shown in FIG. 10, the black matrix 104*a* has three fold angles x1, x2, and x3 in a range where a vertical distance from the center line A is less than or equal to k; the black matrix 104*a* has four fold angles y1, y2, y3, and y4 in a range where a vertical distance from the center line A is from k to (k+(L/2−k)/3); the black matrix 104*a* has six fold angles z1, z2, z3, z4, z5, and z6 in a range where a vertical distance from the center line A is from (k+(L/2−k)/3) to (k+2(L/2−k)/3). An embodiment of the present disclosure increases the quantity of fold angles farther away from the center line of the sub-pixel, which can alleviate grating effects, such as diffraction effects, interference effects, and scattering color separation.

In another exemplary embodiment, the black matrix 104*a* includes at least three fold angles, x1, x2, x3, where x2 is substantially equal to x3 and x1+x2 is substantially equal to 360°, in a range where a vertical distance from the center line A is less than or equal to k (i.e., between the center line A and the first reference line B); the black matrix 104*a* includes at least four fold angles y1, y2, y3, and y4, where y1 and y2 are substantially equal and y3+y4 is substantially equal to 360°, in a range where a vertical distance from the center line A is form k to (k+(L/2−k)/3) (i.e. between the first reference line B and the second reference line C); the black matrix 104*a* includes at least four fold angles: z1 z2, z3, and z4, where z1 and z2 are substantially equal and z3+z4 is substantially equal to 360°, in a range where a vertical distance from the center line A is from (k+(L/2−k)/3) to (k+2 (L/2−k)/3) (i.e. between the second reference line C and the third reference line D).

Exemplary, x1 is approximately equal to 135° and x2 is approximately equal to 225°. Exemplary, y1 is approximately equal to 135° and y3 is approximately equal to 225°.

In another exemplary embodiment, the black matrix 104*a* includes at least three fold angles, x1, x2, x3, where x1, x2 and x3 are substantially equal, within a range where a vertical distance from the center line A that is less than or equal to k (i.e., between the center line A and the first reference line B). In this embodiment, process realization is facilitated by making some angles of the black matrix 104*a* substantially equal.

In another exemplary embodiment as shown in FIG. 10, the black matrix 104*a* includes at least three fold angles, x1, x2, x3, equal to n times 45 degrees, where n=3 or 5, within a range where a vertical distance from the center line A that is less than or equal to k (i.e., between the center line A and the first reference line B). In this embodiment, process realization is facilitated by making some angles of the black matrix 104*a* be an integral multiple of 45°.

Figure 11:
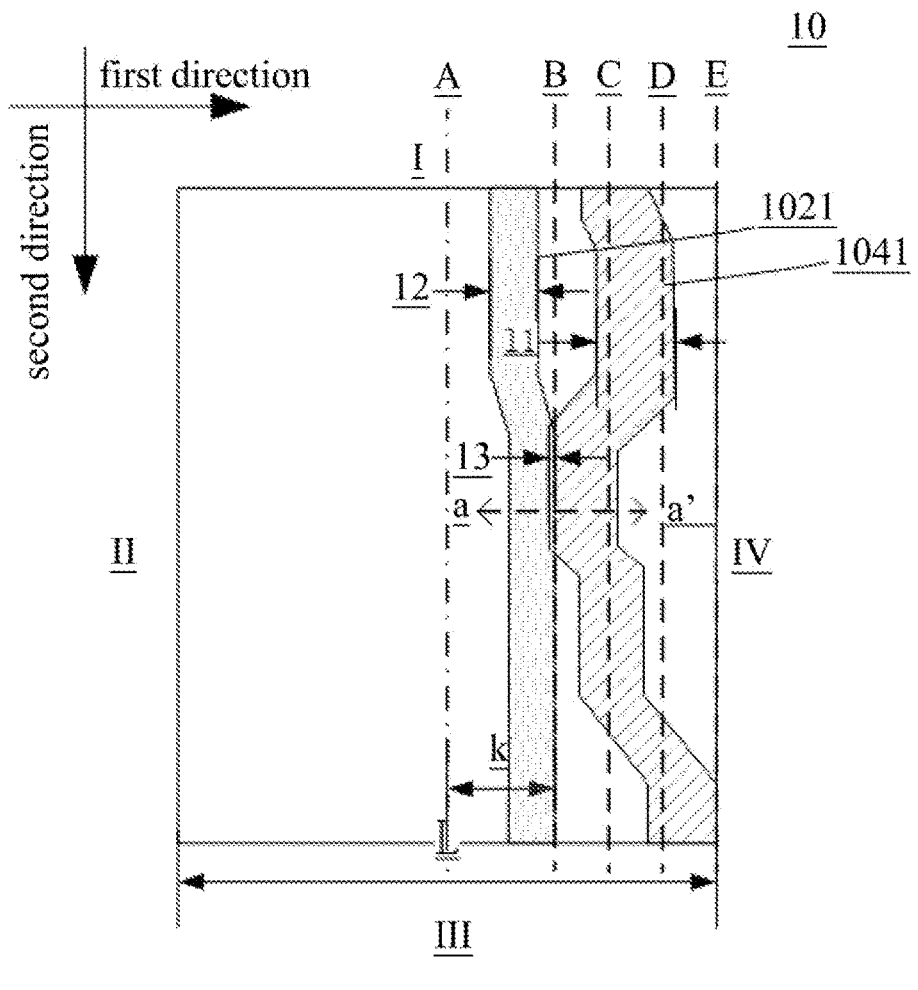
FIG. 11 is a schematic view of an overlapping structure of a first signal line and a first sub-side in a sub-pixel according to an exemplary embodiment of the present disclosure.
Figure 12:
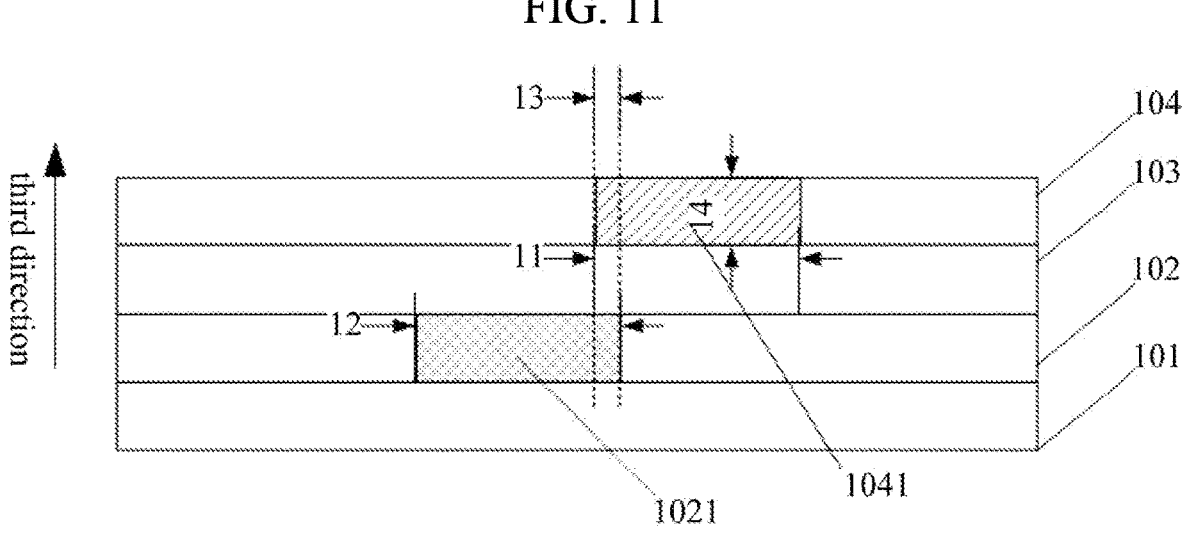
FIG. 12 is a schematic cross-sectional view of a structure of an area aa' in FIG. 11.

In an exemplary embodiment, FIG. 12 is a schematic cross-sectional view of a structure of an area aa' in FIG. 11. As shown in FIG. 11 and FIG. 12, the display substrate includes a base substrate 101, a drive circuit layer 102 provided on the base substrate 101, a light-emitting structure layer 103 (including a pixel defining layer, an organic light-emitting layer, an anode, a cathode, and the like) provided on the drive circuit layer 102, and a color film structure layer 104 provided on the light-emitting structure layer 103, the color film structure layer 104 includes a black matrix 104*a*, the black matrix 104*a* includes at least a first sub-side 1041. The drive circuit layer 102 includes at least a first signal line 1021, the first signal line have a second width l2 along the first direction, and the first sub-side 1041 have a first width l1 along the first direction. An orthographic projection of the first signal line 1021 on the base substrate and an orthographic projection of the first sub-side 1041 on the base substrate have a first overlap and the first overlap have a third width l3 along the first direction.

The above widths satisfy the following relationship:

$$10*l1 \le L \le 10*l2.$$

$$2*k < L \le 3*k.$$

Exemplary, L=220 μm, l1=12~20 μm, k is approximately equal to 74 μm, l3 is approximately equal to 8 μm, and l2 is approximately equal to 32 μm.

In another exemplary embodiment, 6*l2<L≤7*l2.

In another exemplary embodiment, 20*l3<L≤35*l3.

In another exemplary embodiment, 3.5*l3<L≤4*l3.

In an exemplary embodiment, the first signal line 1021 has a fold line structure, the black matrix has multiple sub-sides, and a quantity of fold angles of the first signal line in any one sub-pixel region is less than a quantity of fold angles of at least one sub-side of the black matrix and greater than a quantity of fold angles of at least one other sub-side of the black matrix.

As shown in combined FIG. 6 and FIG. 11, the first signal line 1021 has a fold line structure, the black matrix has a sub-side I, a sub-side II, a sub-side III, and a sub-side IV, and a quantity of fold angles of the first signal line in any sub-pixel region is less than a quantity of fold angles of at least one sub-side (such as the sub-side II and the sub-side IV) of the black matrix and greater than a quantity of fold angles of at least one other sub-side (such as the sub-side I and the sub-side III) of the black matrix.

In an exemplary embodiment as shown in FIG. 12, the first sub-side 1041 has a first thickness l4 along a third direction (i.e., a direction perpendicular to and away from the base substrate). Herein, l4 is greater than 0.9 μm and is less than 1.2 μm.

Figure 13:
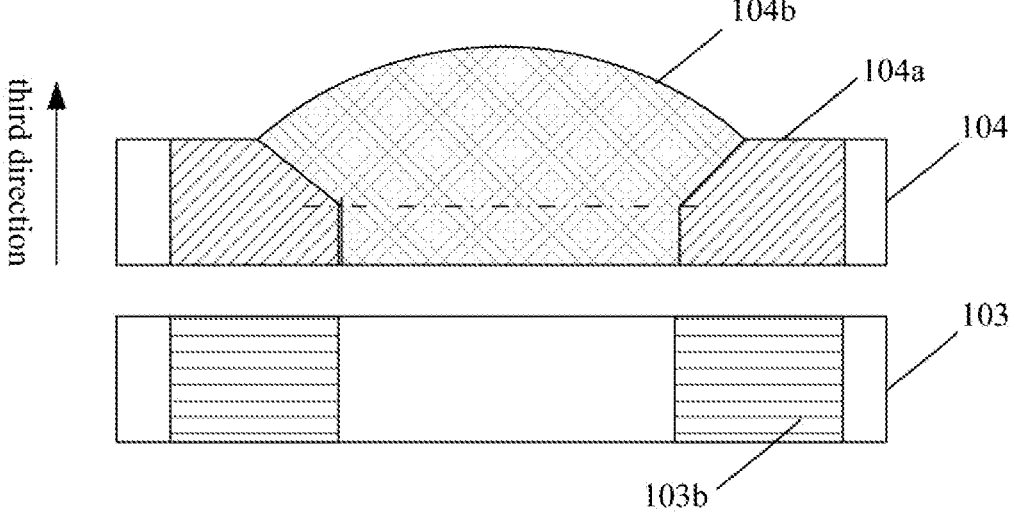
FIG. 13 is a schematic view of a structure of a first opening and a second opening in a sub-pixel according to an exemplary embodiment of the present disclosure.

In an exemplary embodiment as shown in FIG. 13, the color film structure layer 104 includes an annular black matrix 104*a* and a color film 104*b* positioned in an opening of the black matrix 104*a* (i.e., a second opening). An orthographic projection of the color film 104*b* on the base substrate is at least partially overlapped with an orthographic projection of the first opening K1 of the pixel defining layer 103*b* on the base substrate.

In an exemplary embodiment as shown in FIG. 13, the sub-pixel region has a pixel defining layer 103*b* and a color film structure layer 104 provided on the pixel defining layer 103*b*, the color film structure layer 104 includes a black matrix 104*a* and a discrete color film 104*b*, and the black matrix 104*a* includes at least one first sub-side 1041. In the third direction, the color film 104*b* has a maximum thickness greater than the maximum thickness of the first sub-side 1041 of the black matrix and the color film 104*b* is at least partially overlapped with the first sub-side 1041 of the black matrix.

In an exemplary embodiment as shown in FIG. 13, an edge of the black matrix 104*a* close to a side of the color film 104*b* has a step structure. Exemplary, the step structure is a one step structure, that is, only one step surface is included. Since an edge of the black matrix 104*a* close to the color film 104*b* forms a step like structure and the color film 104*b* can be tightly attached to an edge of the black matrix 104*a* close to the color film 104*b*.

Figure 14:
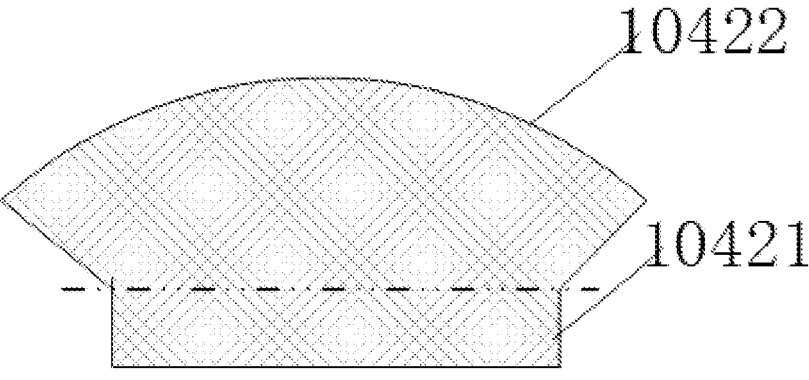
FIG. 14 is a schematic view of a structure of a color film in a sub-pixel according to an exemplary embodiment of the present disclosure.

In an exemplary embodiment as shown in FIG. 14, the color film 104*b* may have a first sub-part 10421 and a second sub-part 10422. The first sub-part 10421 is in contact with the first sub-side 1041 of the black matrix. An orthographic projection of the second sub-part 10422 on the base substrate 30 covers an orthographic projection of the first sub-part 10421 on the base substrate 30. In other words, the second sub-part 10422 may have a protruding structure in a plane parallel to the base substrate with respect to the first sub-part 10421. In this embodiment, an orthographic projection of the second sub-part 10422 on the base substrate is provided to cover an orthographic projection of the first sub-part 10421 on the base substrate, thereby improving light-emission purity of the display substrate.

Figure 15:
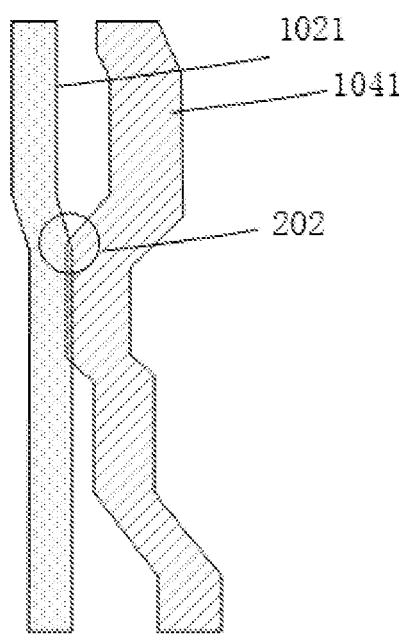
FIG. 15 is a schematic view of an overlapping structure of a first signal line and a first sub-side in another sub-pixel according to an exemplary embodiment of the present disclosure.

In an exemplary embodiment as shown in FIG. 15, the first signal line 1021 also has a fold line shape with a fold angle, and a quantity of fold angles of the first signal line 1021 is less than a quantity of fold angles of first sub-side of the black matrix in any one sub-pixel region. Exemplary, a quantity of fold angles of the first signal line 1021 is less than a quantity of fold angles of the first sub-side (or the second sub-side) of the black matrix and greater than a quantity of fold angles of third sub-side (or the fourth sub-side), which facilitates the realization of the process.

In an exemplary embodiment, the color film 104b covers the fold line structure of the first signal line 1021.

In an exemplary embodiment as shown in FIG. 15, an orthographic projection of the first signal line 1021 on the base substrate and an orthographic projection of the first sub-side 1041 of the black matrix 104a on the base substrate have a first overlap 202 and the first overlap is covered by a color film 104b. Since the first signal line 1021 is metallic, with high reflectivity, has a first overlap 202, and the width 13 of the first overlap is small, combining with FIG. 14, it can ensure that the sub-color film can cover the first signal line 1021, which is beneficial to reduce reflection and improve light-emission purity.

In an exemplary embodiment, the first signal line 1021 has a fold line structure, the black matrix has a multiple sub-sides (a sub-side I, a sub-side II, a sub-side III, a sub-side IV), and a quantity of fold angles of the first signal line 1021 in any one sub-pixel region is less than a quantity of fold angles of at least one sub-side (exemplary, a sub-side II or a sub-side IV) of the black matrix and greater than a quantity of fold angles of at least one other sub-side (exemplary, a sub-side I or a sub-side III) of the black matrix.

Figure 16:
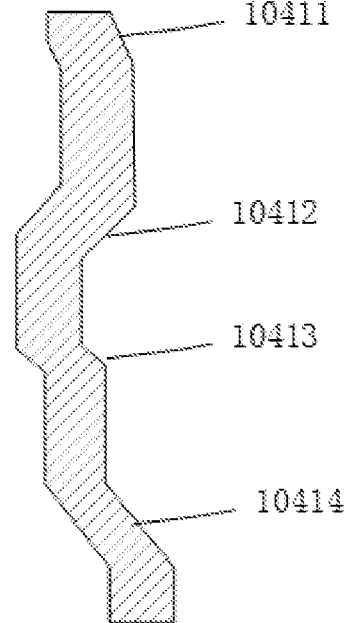
FIG. 16 is a schematic view of a structure of a first sub-side in another sub-pixel according to an exemplary embodiment of the present disclosure.

In an exemplary embodiment as shown in FIG. 16, the first sub-side 1041 of the black matrix 104a has multiple third sub-line segments. The multiple third sub-line segments are neither parallel nor perpendicular to the first direction or the second direction. In addition, the multiple third sub-line segments are provided separately from each other and the multiple third sub-line segments are separated from each other by other sub-line segments parallel to the first direction or parallel to the second direction.

Exemplary as shown in FIG. 16, the first sub-side 1041 of the black matrix 104a has four third sub-line segments 10411 to 10414. The four third sub-line segments 10411 to 10414 are neither parallel nor perpendicular to the first direction or the second direction. Also, the four third sub-line segments 10411 to 10414 are provided separately from each other, and the four third sub-line segments 10411 to 10414 are separated from each other by other sub-line segments parallel to the second direction.

Figure 17:
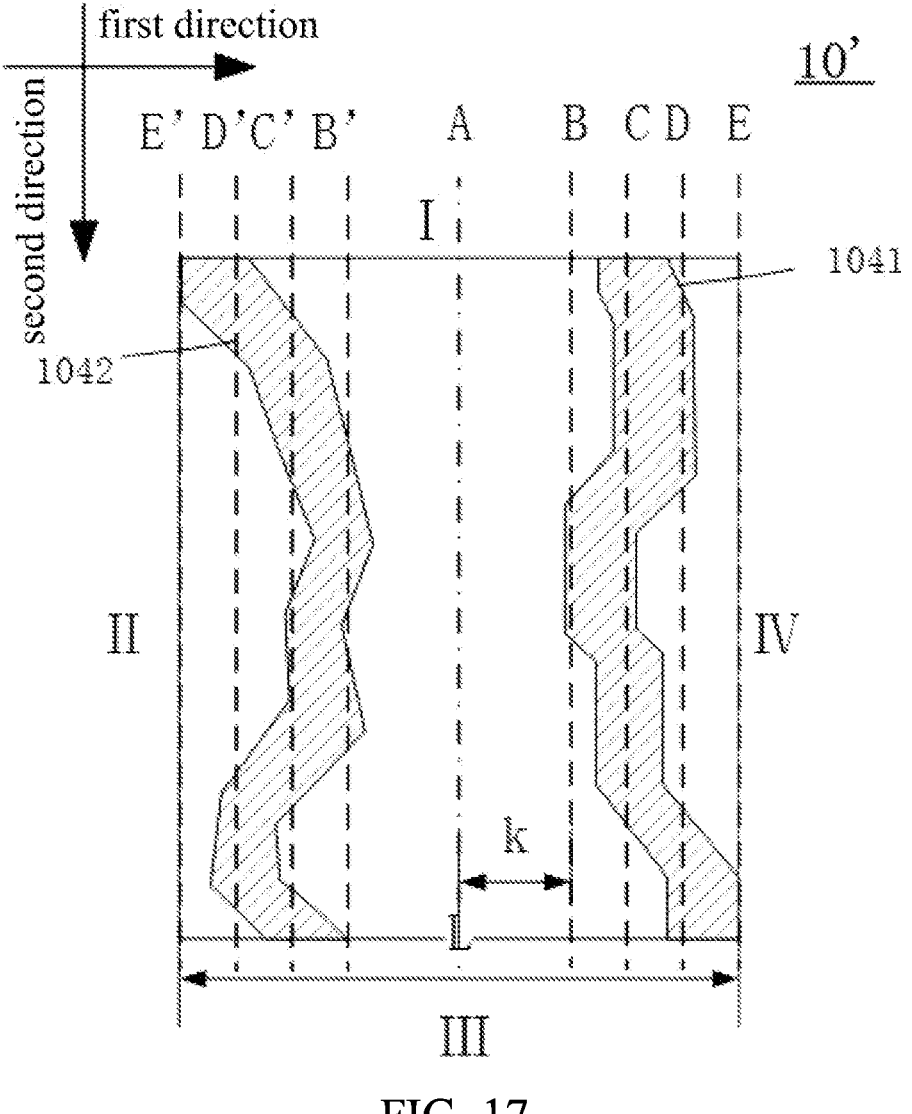
FIG. 17 is a schematic view of a structure of a first sub-side and a second sub-side of a sub-pixel according to an exemplary embodiment of the present disclosure.

In an exemplary embodiment as shown in FIG. 17, the black matrix 104a has a second sub-side 1042 provided opposite to the first sub-side 1041. As shown in FIG. 17, the sub-pixel 10' has another side which is opposite to the fourth side IV, that is the second side II, and the black matrix has a second sub-side 1042.

In FIG. 17, a first reference line B and a fifth reference line B' may be provided at a distance k from the center line A.

The sub-pixel region may also include a second reference line C, a third reference line D, a fourth reference line E, a sixth reference line C', a seventh reference line D', and an eighth reference line E', the fifth reference line B', the sixth reference line C', the seventh reference line D', and the eighth reference line E' are symmetrical structures of the first reference line B, the second reference line C, the third reference line D, and the fourth reference line E with respect to the center line A, respectively. That is to say, the center line A and the fifth reference line B' also have a distance of k, and the distances between the fifth reference line B' to the sixth reference line C', the sixth reference line C' to the seventh reference line D', and the seventh reference line D' to the eighth reference line E' are also n. In addition, the second sub-side 1042 of the black matrix 104a also has a fold line structure and the fold line structure has a fold angle.

In an exemplary implementation, a quantity of fold angles x' between the center line A and the fifth reference line B', the quantity of folds angles y' between the fifth reference line B' and the sixth reference line C', and the quantity of fold angles z' between the sixth reference line C' and the seventh reference line D' satisfy the following conditions: x=x', y≠y', z≠z'.

Because x is relatively small, x' is also relatively small, that is to say, a quantity of fold angles of the folded line structure close to the center line A of sub-pixels is small. y≠y', z≠z', that is, the first sub-side 1041 and the second sub-side 1042 are provided asymmetrically, so that a better display effect can be achieved that is less interference and diffraction structure can be achieved.

In an exemplary implementation, in a sub-pixel region, a quantity of fold angles x' between the center line A and the fifth reference line B', a quantity of fold angles y' between the fifth reference line B' and the sixth reference line C', and a quantity of fold angles z' between the sixth reference line C' and the seventh reference line D' of the second sub-side 1042 satisfy the following conditions: x'≤y'≤z'.

In an exemplary implementation, a quantity of fold angles of the second sub-side 1042 between the center line A and the fifth reference line B' is equal to or greater than 2; a quantity of fold angles of the second sub-side 1042 between the fifth reference line B' and the sixth reference line C' is equal to or greater than 3; and a quantity of fold angles of the second sub-side 1042 between the sixth reference line C' and the seventh reference line D' is equal to or greater than 3.

Figure 18:
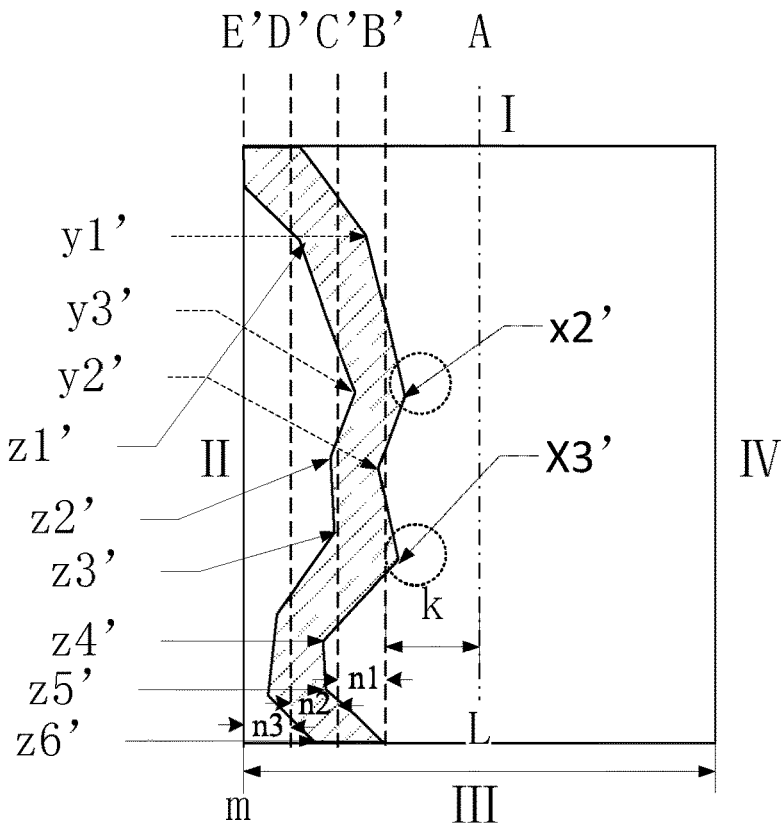
FIG. 18 is a schematic view of a structure of a second sub-side in a sub-pixel according to an exemplary embodiment of the present disclosure.

Exemplary as shown in FIG. 18, the second sub-side 1042 includes a quantity of fold angles x'=2 in a range where the vertical distance from the center line A is less than or equal to k (i.e., between the center line A and the fifth reference line B'). The second sub-side 1042 includes a quantity of fold angles y'=3 in a range where a vertical distance from the center line is from k to (k+(L/2–k)/3) (i.e., between the fifth reference line B' and the sixth reference line C') and a quantity of fold angles z'=6 in a range where a vertical distance from the center line is from (k+(L/2–k)/3) to (k+2 (L/2–k)/3) (i.e., between the sixth reference line C' and the seventh reference line D').

In an exemplary implementation, the second sub-side 1042 has at least two substantially equal fold angles between the center line A and the fifth reference line B'; the second sub-side 1042 has at least two substantially equal fold angles between the fifth reference line B' and the sixth reference line C'; and the second sub-side 1042 has at least two substantially equal fold angles between the sixth reference line C' and the seventh reference line D'.

Exemplary, the second sub-side 1042 has two fold angles x2' and x3' between the center line A and the fifth reference line B', and x2' and x3' are substantially equal, the second sub-side 1042 has three folds y1', y2', and y3' between the fifth reference line B' and the sixth reference line C', where y2' and y3' are substantially equal, and the second sub-side 1042 has six folds z1', z2', z3', z4', z5' and z6' between the sixth reference line C' and the seventh reference line D', where z3' and z4' are substantially equal.

In an exemplary implementation, the second sub-side 1042 has at least one fourth fold angle between the center line A and the fifth reference line B'; the second sub-side 1042 has at least one fifth fold angle between the fifth reference line B' and the sixth reference line C'; the second sub-side 1042 has at least one sixth fold angle between the sixth reference line C' and the seventh reference line D', and the angles of the fourth fold angle, the fifth fold angle, and the sixth fold angle are substantially equal.

Exemplary, the second sub-side 1042 has a fold angle x2' between the center line A and the fifth reference line B', a fold angle y2' between the fifth reference line B' and the sixth reference line C', and a fold angle z3' between the sixth reference line C' and the seventh reference line D', satisfying that x2', y2', and z3' are substantially equal.

Figure 19:
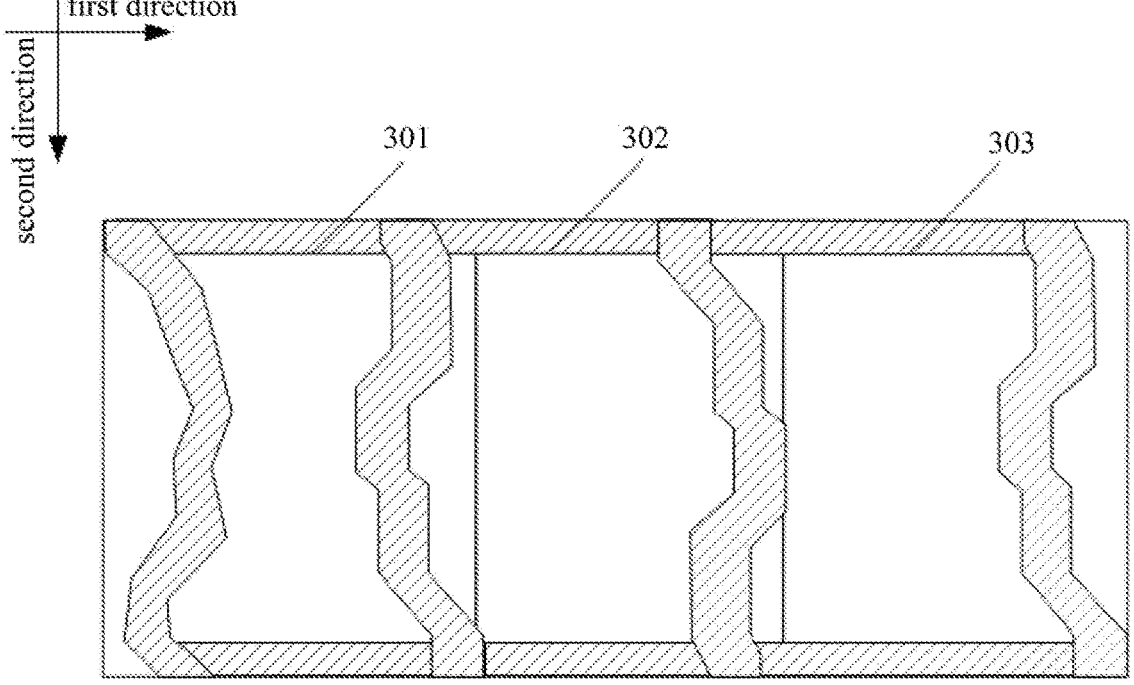
FIG. 19 is a schematic view of a structure of a black matrix in a kind of adjacent pixels according to an exemplary embodiment of the present disclosure.

In an exemplary embodiment as shown in FIG. 19, the black matrix 104a includes a third sub-side connecting the first sub-side and the second sub-side, and a fourth sub-side connecting the first sub-side and the second sub-side, the first sub-side, the third sub-side, the fourth sub-side and the second sub-side are head to tail connected to form a second opening.

In an exemplary embodiment as shown in FIG. 19, the third sub-side is parallel to the first direction and the fourth sub-side is parallel to the first direction.

In an exemplary embodiment as shown in FIG. 19, a one-pixel unit in the display substrate may include a first sub-pixel 301, a second sub-pixel 302, and a third sub-pixel 303. Any two adjacent sub-pixels have different sides of black matrix. In this way, better display effect can be achieved, that is, less interference and diffraction structure can be achieved. Exemplary, the first sub-pixel 301, the second sub-pixel 302, and the third sub-pixel 303 may be red (R) sub-pixels, green (G) sub-pixels and blue (B) sub-pixels, which is not limited in the present disclosure.

Figure 20:
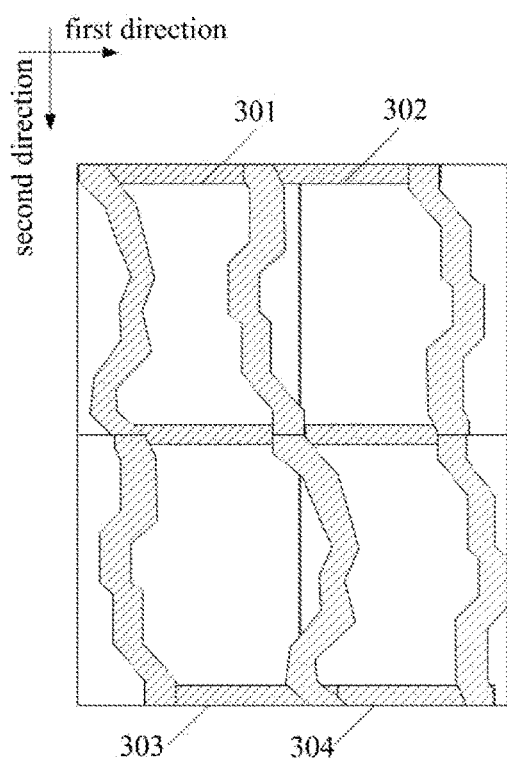
FIG. 20 is a schematic view of a structure of a black matrix in another kind of adjacent pixels according to an exemplary embodiment of the present disclosure.

In another exemplary embodiment as shown in FIG. 20, the one-pixel unit in the display substrate may include a first sub-pixel 301, a second sub-pixel 302, a third sub-pixel 303, and a fourth sub-pixel 304. At this time, the sub-sides of the black matrix in each sub-pixel may be different, so that a better display effect that is a less interference and diffraction structure may be achieved.

In an exemplary implementation, a pixel arrangement may be a layout according to FIG. 20 with 2 sub-pixels arranged along the first direction and the other 2 sub-pixels arranged along the second direction. Of course, the sub-pixels may be arranged according to other pixel structures.

Exemplary, the first sub-pixel 301, the second sub-pixel 302, the third sub-pixel 303, and the fourth sub-pixel 304 may be red (R) sub-pixels, green (G) sub-pixels, blue (B) sub-pixels, and white (W) sub-pixels, which is not limited by the present disclosure.

In an exemplary embodiment, a quantity of fold angles of the first sub-side of the black matrix in the green (G) sub-pixel is less than a quantity of fold angles of the first sub-side of the black matrix in the blue (B) sub-pixel.

In an exemplary embodiment, areas of the second openings formed by the black matrices of different sub-pixels may be different and an area of the second opening formed by the black matrix of each sub-pixel may be configured according to luminance requirements. Exemplary, a second opening formed by a green (G) sub-pixel has a smallest area and a second opening formed by a white (W) sub-pixel has a largest area.

In an exemplary embodiment, when a sub-pixel includes a red (R) sub-pixel, a green (G) sub-pixel, a blue (B) sub-pixel, and a white (W) sub-pixel, the white (W) sub-pixel may not have a color film on the white (W) sub-pixel.

Figure 21:
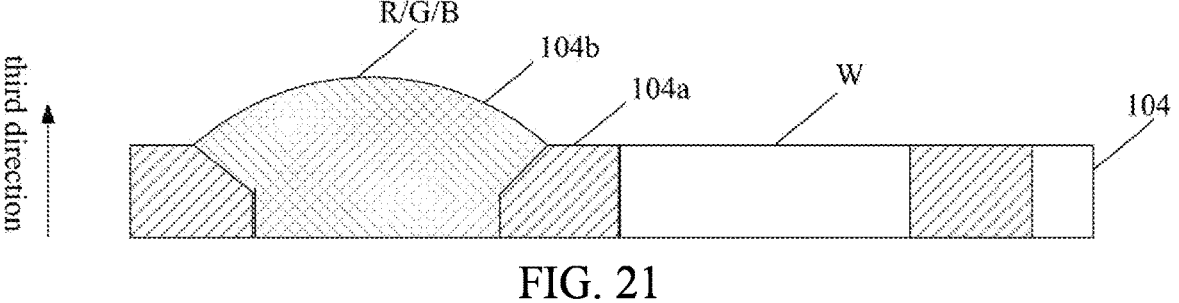
FIG. 21 is a schematic view of a structure of a color film in a kind of sub-pixels of different colors according to an exemplary embodiment of the present disclosure.

Exemplary as shown in FIG. 21, the green (G) sub-pixel, the red (R) sub-pixel, and the blue (B) sub-pixel all include a color film and the white (W) sub-pixel may not have a color film.

Figure 22:
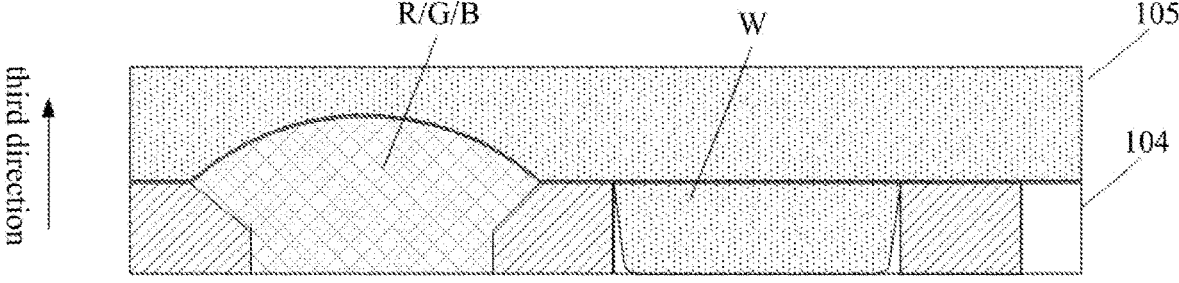
FIG. 22 is a schematic view of an encapsulation structure in a kind of sub-pixels of different colors according to an exemplary embodiment of the present disclosure.

In an exemplary embodiment as shown in FIG. 22, a display substrate may further include an encapsulation layer 105 provided on a side of the color film structure layer 13 away from the light-emitting structure layer 103. The encapsulation layer 105 may include a first encapsulation layer and a second encapsulation layer that are stacked. The first encapsulation layer may be made of an organic material, the second encapsulation layer may be made of an inorganic material, which may ensure that external water vapor cannot enter the light-emitting structure layer and the color film structure layer.

Since there may be no color film on the white (W) sub-pixel, the first encapsulation layer can cover and fill the white (W) sub-pixel. That is, the filling structure on the white (W) sub-pixel is the same as a material of the first encapsulation layer and is an integral structure.

Figure 23:
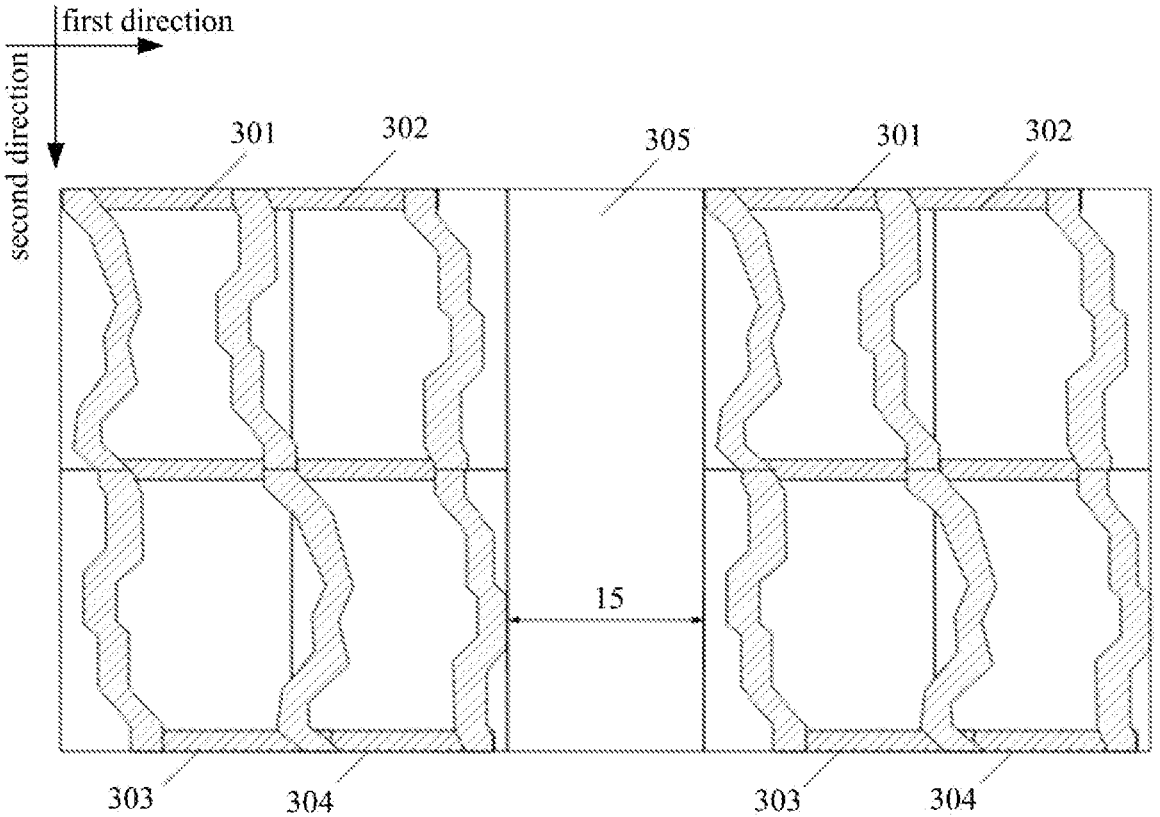
FIG. 23 is a schematic view of a structure of a blank structure in a sub-pixel according to an exemplary embodiment of the present disclosure.

In an exemplary embodiment as shown in FIG. 23, the display substrate may also include a blank structure 305, an orthographic projection on the base substrate is not over-lapped with an orthographic projection of the drive circuit on the base substrate, thus contributing to increased trans-mittance.

In an exemplary embodiment, a blank structure may account for 45% or more of an area of the display region, and exemplary, a blank structure may account for 46% of an area of the display region.

In an exemplary embodiment, the blank structure has a width l5 in the first direction where the width is defined as a distance between two sides that are substantially parallel along the second direction. Here a width l5 may be equal to or substantially equal to a total length of each fold line structure of a sub-side 1041 of the black matrix in the first direction. Thus, the blank structure 305 can be uniformly provided on the display substrate and a better display effect can be achieved.

In an exemplary embodiment, the blank structure has a first sub-edge adjacent to a first sub-side of a white sub-pixel region and a first sub-side of a red sub-pixel region, a shape of the first sub-edge is conformal with a shape of the first sub-side of the white sub-pixel region and the first sub-side of the red sub-pixel region. In an embodiment of the present disclosure, the "conformity" of A and B means that adjacent edges of A and B are identical in shape, or A and B share a certain edge as an edge between A and B.

In an exemplary embodiment, the blank structure 305 is not necessarily rectangular and may also be an area between two sub-sides of the black matrix 104a along the first direction. That is, side edges of the blank structure 305 also have a fold line structure and have a fold angle. In this way, regular traces can be further removed, diffraction and inter-ference effects can be reduced, and the display effect can be improved.

Figure 24:
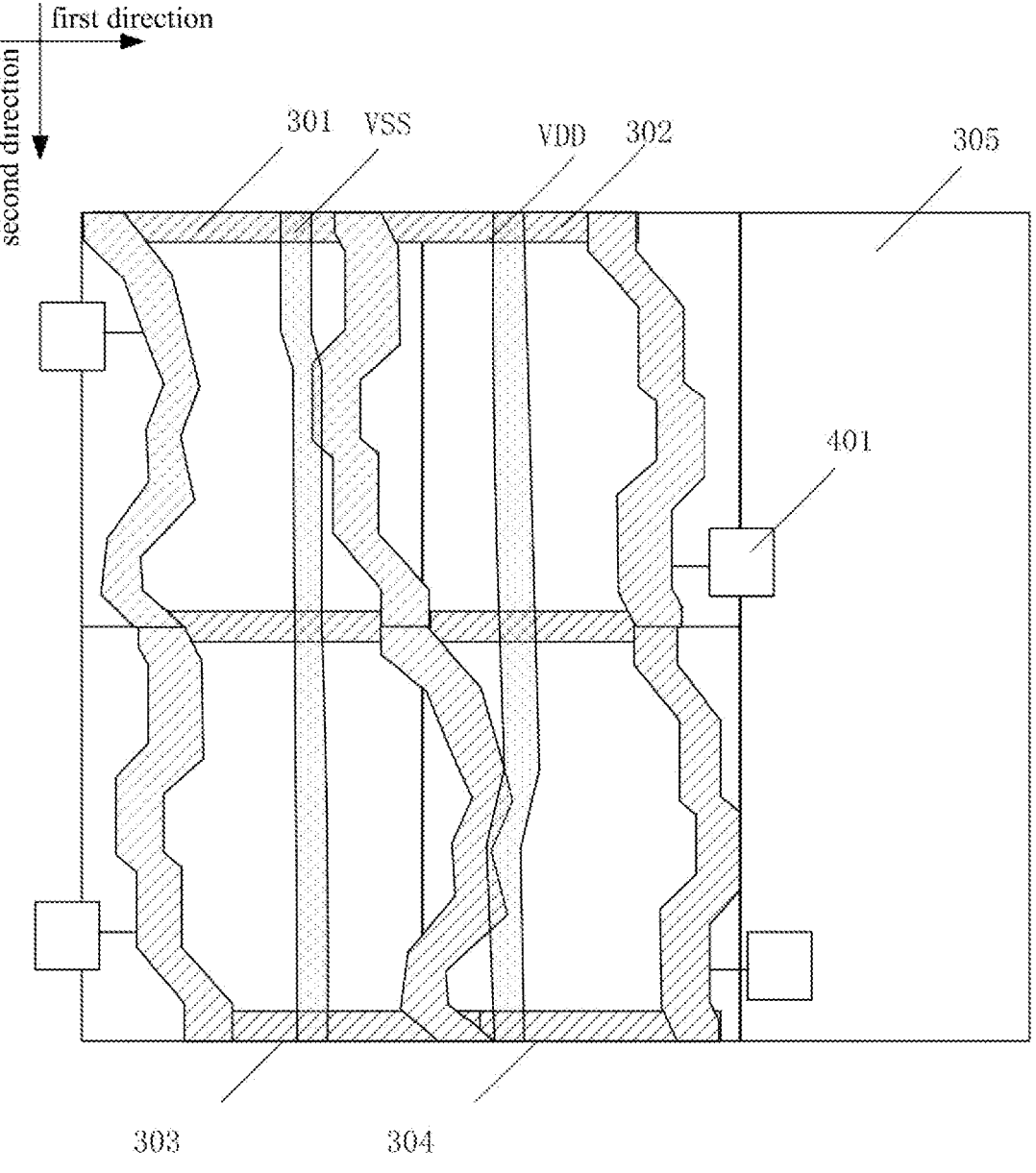
FIG. 24 is a schematic view of a repairing structure in a sub-pixel according to an exemplary embodiment of the present disclosure.

In an exemplary embodiment as shown in FIG. 24, a sub-pixel may include a first power supply line VDD and the first power supply line VDD continuously provides a high-level signal. Referring to FIG. 15, the aforementioned first signal line 1021 may be a first power supply line VDD. In this embodiment, the color film between the black matrices completely covers the first power supply line VDD, thereby reducing reflectivity and improving light-emission purity.

In an exemplary embodiment as shown in FIG. 24, the sub-pixel may include a second power supply line VSS and the second power supply line VSS continuously provides a low-level signal. Referring to FIG. 15, the aforementioned first signal line 1021 may be a second power supply line VSS. In this embodiment, the color film between the black matrices completely covers the first power supply line VDD, thereby reducing reflectivity and improving light-emission purity.

In an exemplary embodiment as shown in FIG. 24, the sub-pixel may include a repairing structure 401. The repairing structure 401 may be electrically connected with multiple pixel electrodes.

In an exemplary embodiment, the repairing structure 401 may be electrically connected with first electrodes of two sub-pixels. Here, the light-emitting layer may include an electroluminescent layer between a first electrode and a second electrode. Exemplary, the first electrode may be an anode and the second electrode may be a cathode. Anodes of the adjacent sub-pixels may be a separate block structure, while cathodes of the adjacent sub-pixels may be a whole surface structure.

In an exemplary embodiment, multiple sub-pixel regions include a red sub-pixel region and a blue sub-pixel region, and the repairing structure of the red sub-pixel region and the repairing structure of the blue sub-pixel region are at least partially symmetrical and at least partially asymmetrical.

In an exemplary embodiment, an orthographic projection of the color film on the base substrate may cover an orthographic projection of a corresponding drive circuit layer on the base substrate, which can further reduce reflection, improve light-emission efficiency and improve display effect.

In an exemplary embodiment, the light emitting structure layer further includes an anode, the first opening at least partially exposing the anode, and at least one sub-pixel region includes multiple sub-anode blocks provided separately.

Figure 25:
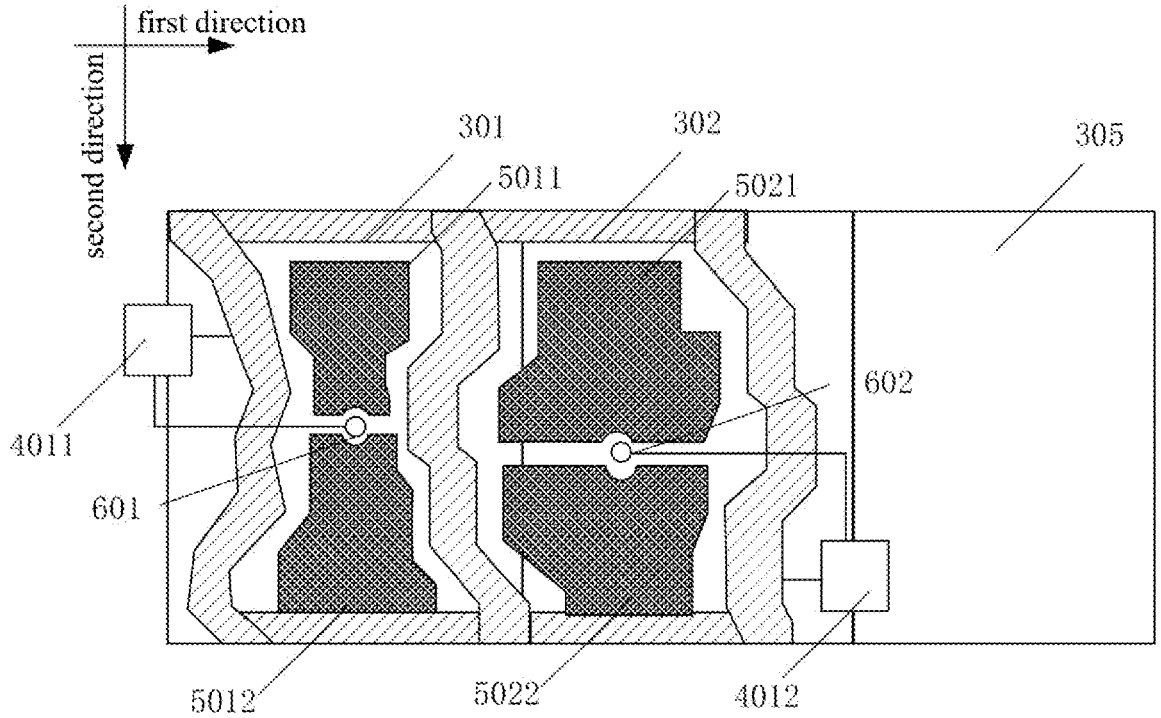
FIG. 25 is a schematic view of a repairing structure in another sub-pixel according to an exemplary embodiment of the present disclosure.

In an exemplary embodiment as shown in FIG. 25, an anode of the display substrate includes at least two discrete sub-anode blocks, i.e. the anode is a discrete structure, and an edge of at least one sub-anode may include a fold line structure. In this way, diffraction effect can be reduced and display effect can be improved.

In an exemplary embodiment as shown in FIG. 25, taking any two adjacent sub-pixels 301, 302 as an example, each sub-pixel may include at least two sub-anodes provided discretely. Exemplary, the sub-pixel 301 includes a first sub-anode block 5011 and a second sub-anode block 5012 that are separated, and both of the first sub-anode block 5011 and the second sub-anode block 5012 have a fold line structure to enhance display effect; the sub-pixel 302 includes a third sub-anode block 5021 and a fourth sub-anode block 5022 that are separated, and both of the third sub-anode block 5011 and the fourth sub-anode block 5012 have a fold line structure to enhance display effect.

In an exemplary embodiment, multiple sub-anode blocks have different morphologies. In this embodiment, multiple sub-anode blocks have different morphologies, which means that the shapes of orthographic projections of the multiple sub-anode blocks on the base substrate are different, or the shapes of orthographic projections of the multiple sub-anode blocks on the base substrate are same, but a superposition direction is different.

Exemplary as shown in FIG. 25, a shape of an orthographic projection of the first sub-anode block 5011 on the base substrate may be different from a shape of an orthographic projection of the second sub-anode block 5012 on the base substrate.

In an exemplary embodiment, shapes of orthographic projections of sub-anode blocks in adjacent sub-pixels on the base substrate may be different, and, exemplary as shown in FIG. 25, the shapes of the orthographic projections of multiple sub-anode blocks 5011, 5012, 5021, 5022 on the base substrate are different. The shapes of the orthographic projections are different in an embodiment of the present disclosure means that an orthographic projection of one sub-anode block on the base substrate cannot be overlapped with an orthographic projection of another sub-anode block on the base substrate after being translated.

In an exemplary embodiment, multiple sub-anode blocks in a same sub-pixel are respectively connected with a connection structure, respectively. Exemplary as shown in FIG. the first sub-anode block 5011 and the second sub-anode block 5012 are electrically connected with a first connection structure 601, respectively. The third sub-anode block 5021 and the fourth sub-anode block 5022 are electrically connected with a second connection structure 602, respectively.

Figure 26:
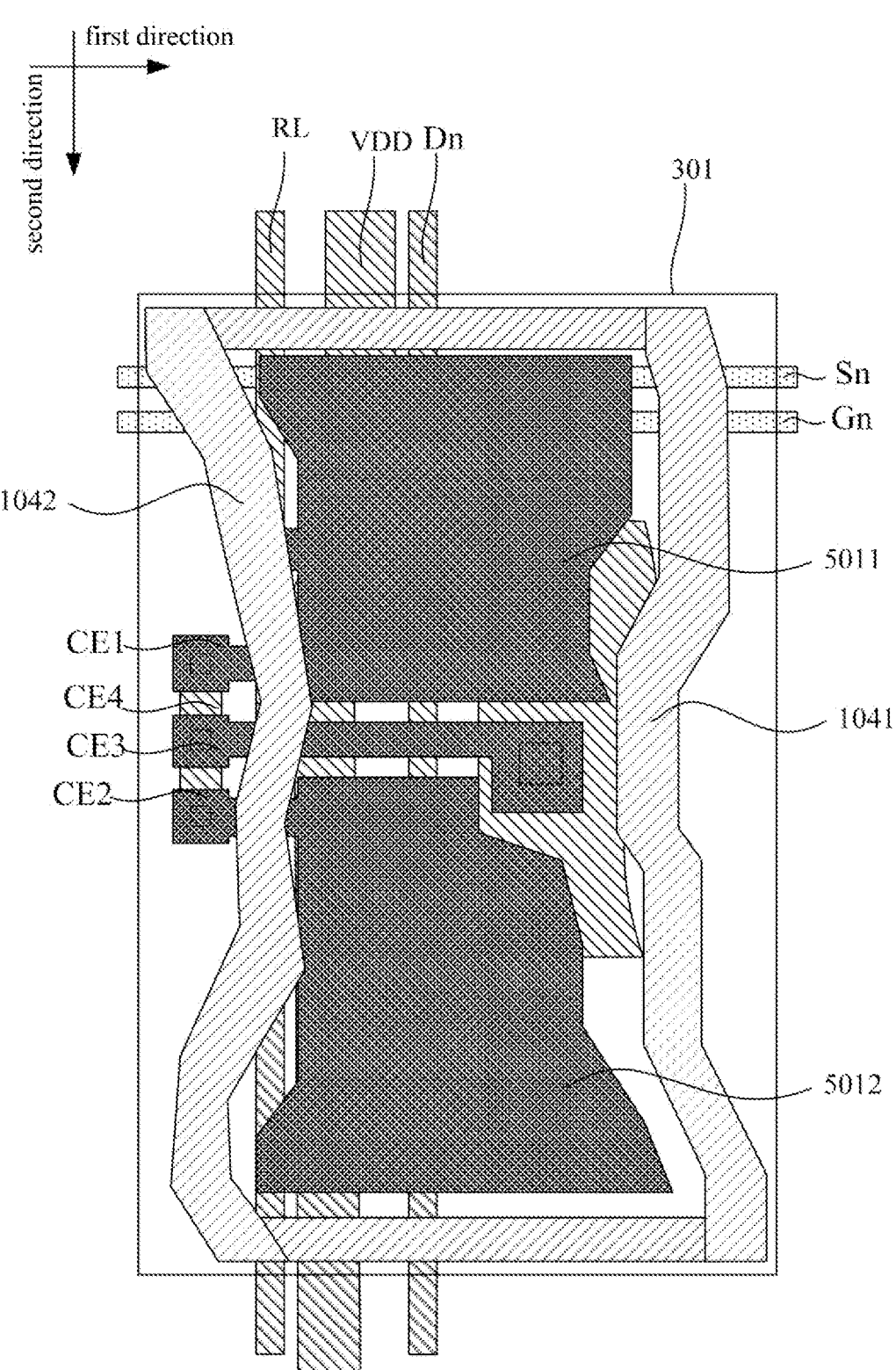
FIG. 26 is a schematic view of a repairing structure in yet another sub-pixel according to an exemplary embodiment of the present disclosure.

As shown in FIG. 26 the first connection structure 601 may include a first connection electrode CE1 extending in a first direction from a first end of the first sub-anode block 5011; a second connection electrode CE2 extending in a first direction from a first end of the second sub-anode block 5012; a third connection electrode CE3 electrically connected with a drive transistor (exemplary, a second transistor T2 in FIG. 8) and extending in a first direction; and a fourth connection electrode CE4 including a first end in contact with the first connection electrode CE1 and a second end in contact with the second connection electrode CE2, and the fourth connection electrode CE4 is in contact with the third connection electrode CE3 between the first end and the second end. At this time, the fourth connection electrode CE4 is arranged in a layer different from at least one of the first connection electrode E1 to the third connection electrode CE3, and is in contact with the first connection electrode CE1 to the third connection electrode CE3.

The first connection electrode CE1, the second connection electrode CE2, and the third connection electrode CE3 are spaced apart from each other and arranged in parallel. The first connection electrode CE1 may be formed integrally with the first sub-anode block 5011 and the second connection electrode CE2 may be formed integrally with the second sub-anode block 5012. The third connection electrode CE3 is spaced apart from the first sub-anode block 5011 and the second sub-anode block 5012 and provided between the first sub-anode block 5011 and the second sub-anode block 5012.

The third connection electrode CE3 may be made of a same material as a material constituting at least one of the first sub-anode block 5011, the second sub-anode block 5012, the first connection electrode CE1 and the second connection electrode CE2, or the third connection electrode CE3 may be provided in a same layer as at least one of the first sub-anode block 5011, the second sub-anode block 5012, the first connection electrode CE1, and the second connection electrode CE2. The third connection electrode CE3 connected with the drive transistor may be electrically connected with the first connection electrode CE1 and the second connection electrode CE2 to drive the first sub-light-emitting unit corresponding to the first sub-anode block 5011 and the second sub-light-emitting unit corresponding to the second sub-anode block 5012 through a drive transistor.

The connection electrode CE4 may be arranged in a second direction different from or perpendicular to the first direction in which the first connection electrode CE1 to the third connection electrode CE3 are arranged, and the connection electrode CE4 electrically connects the first connection electrode CE1, the second connection electrode CE2, and the third connection electrode CE3 to each other. The fourth connection electrode CE4 is arranged in a layer different from at least one of the first connection electrode CE1, the second connection electrode CE2, and the third connection electrode CE3. The fourth connection electrode CE4 connects the first connection electrode CE1 and the third connection electrode CE3 through a bridge, or the second connection electrode CE2 and the third connection electrode CE3 through a bridge.

The fourth connection electrode CE4 may be arranged in a same layer as the active layer constituting the drive thin film transistor. The first connection electrode CE1, the second connection electrode CE2, and the third connection electrode CE3 are in contact with the fourth connection electrode CE4 by passing through a via on an insulation layer arranged on the fourth connection electrode CE4. The fourth connection electrode CE4 may be made of a same material as a material constituting an active layer of the drive thin film transistor.

Referring to FIG. 8, a drive transistor and at least two switch transistors may be required to drive a sub-pixel. A gate electrode of a switch transistor (a first transistor T1 in FIG. 8) is connected with a first scan signal line Sn to supply a signal of a data signal line Dn connected with a source electrode/drain electrode of the switch transistor to a gate electrode of a drive transistor (a second transistor T2 in FIG. 8).

The drive transistor applies a voltage VDD connected with the source electrode/drain electrode at a side of the drive transistor to the first sub-anode block 5011 and the second sub-anode block 5012 in response to a signal of a gate electrode. At this time, the first connection structure 601 is electrically connected between the source electrode/drain electrode at the other side of the drive transistor and the first sub-anode block 5011 and the second sub-anode block 5012 to apply a voltage or current of the source electrode/drain electrode at the other side of the drive transistor to the first sub-anode block 5011 and the second sub-anode block 5012 through the first connection structure 601. Another switch transistor (a third transistor T3 in FIG. 8) is connected with the source electrode/drain electrode on the other side of the drive transistor, the gate electrode of the switch transistor is connected with the second scan signal line Sn, and the reference voltage VRef is connected with a side of the source electrode/drain electrode of the switch transistor.

If dark spots or bright spots appear in any one sub-pixel of the display panel, a part of the fourth connection electrode CE4 of the first connection structure 601 may be laser cut, whereby the first sub-anode block 5011 or the second sub-anode block 5012 from one sub-pixel may be electrically connected with the drive transistor.

For example, laser cut may be performed for the fourth connection electrode CE4 between the second connection electrode CE2 and the third connection electrode CE3, whereby the second sub-anode block 5012 connected with the second connection electrode CE2 is electrically disconnected from the drive transistor, and the second light-emitting unit corresponding to the second sub-anode block 5012 becomes a floating state. At this time, the first sub-anode block 5011 may be electrically connected with the drive transistor through the third connection electrode CE3, which is electrically connected with the drive transistor through the first connection electrode CE1 and the fourth connection electrode CE4, and thus the first sub-anode block 5011 may be driven.

That is to say, even if dark spots or bright spots appear in a sub-pixel, laser cut can be performed for the fourth connection electrode CE4 to float a sub-light-emitting unit, whereby the sub-pixel can be normally driven.

Although it is shown that laser cut is performed for the fourth connection electrode CE4 between the second connection electrode CE2 and the third connection electrode CE3, laser cut may also be executed for the fourth connection electrode CE4 between the first connection electrode CE1 and the third connection electrode CE3.

If dark spots or bright spots occur in the first sub-light-emitting unit area corresponding to the first sub-anode block 5011, laser cut may be performed for the fourth connection electrode CE4 between the first connection electrode CE1 and the third connection electrode CE3, thereby electrically disconnecting the first sub-anode block 5011 connected with the first connection electrode CE1 from the drive transistor and changing the first sub-light-emitting unit corresponding to the first sub-anode block 5011 into a floating state. At this time, the second sub-anode block 5012 may be electrically connected with the drive transistor through the third connection electrode CE3, which is electrically connected with the drive transistor through the second connection electrode CE2 and the fourth connection electrode CE4, and thus the second sub-anode block 5012 may be driven.

Even if dark spots or bright spots appear in a sub-pixel, laser cut can be performed for the fourth connection electrode CE4 to drive the second sub-light-emitting unit, whereby the sub-pixel can be normally driven.

If dark spots or bright spots appear in the sub-pixel, the first connection electrode CE1 and the fourth connection electrode CE4 arranged on a layer different from the third connection electrode CE3 may be separated from each other between the first connection electrode CE1 and the third connection electrode CE3, and the second connection electrode CE2 and the fourth connection electrode CE4 arranged on a layer different from the third connection electrode CE3 may be separated from each other between the second connection electrode CE2 and the third connection electrode CE3.

If no dark spots or bright spots occur in the sub-pixel, the fourth connection electrode CE4 electrically connects the first connection electrode CE1, the second connection electrode CE2, and the third connection electrode CE3 to each other as described above.

In an exemplary embodiment, when a fault such as an open circuit occurs in a sub-pixel drive circuit corresponding to the sub-pixel, lighting can be completed by ablating the electrical connection between the repairing structure and the connection structure so that the sub-pixel is electrically connected with an adjacent sub-pixel drive circuit. Exemplary, when a fault such as an open circuit occurs in the sub-pixel drive circuit corresponding to the sub-pixel 301, the first repairing structure 4011 and the first connection structure 601 can be electrically connected by ablation, so that the sub-pixel 301 is electrically connected with an adjacent sub-pixel drive circuit, and lighting can be completed.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being provided on a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" refers to a boundary of the orthographic projection of B falling within a range of a boundary of the orthographic projection of A, or a boundary of the orthographic projection of A is overlapped with a boundary of the orthographic projection of B.

In an exemplary implementation mode, the preparation process of the display substrate may include following operations.

(1) Firstly, a pattern of the drive circuit layer 102 is prepared on the base substrate 101. The drive circuit layer 102 includes multiple gate lines and multiple data signal lines, the multiple gate lines and the multiple data signal lines are intersected to define multiple pixel units arranged in a matrix, each pixel unit includes at least three sub-pixels, and each sub-pixel includes a thin film transistor (TFT). In this embodiment, one pixel unit includes three sub-pixels, namely a red sub-pixel R, a green sub-pixel G, and a blue sub-pixel B respectively. Of course, the solution of this embodiment is also applicable to a case where one pixel unit includes four sub-pixels (a red sub-pixel R, a green sub-pixel G, a blue sub-pixel B, and a white sub-pixel W).

In an exemplary implementation, the base substrate 101 may be a flexible base substrate, or a rigid base substrate. In an exemplary embodiment, the flexible base substrate may include a first flexible material layer, a first inorganic material layer, a semiconductor layer, a second flexible material layer, and a second inorganic material layer which are stacked. Materials of the first flexible material layer and second flexible material layer may be polyimide (PI), polyethylene terephthalate (PET), or a polymer soft film subjected to surface treatment, etc. Materials of the first inorganic material layer and second inorganic material layer may be silicon nitride (SiNx), silicon oxide (SiOx), or the like, so as to improve water-oxygen resistance capability of the substrate. The first inorganic material layer and second inorganic material layer are also referred to as barrier layers.

A material of the semiconductor layer may be amorphous silicon (a-si). In an exemplary implementation, taking one stacked layer structure as an example, a preparation process thereof may include: first, coating a layer of polyimide on a glass carrier plate, and forming a first flexible (PI1) layer after curing into a film; then depositing a layer of barrier thin film on the first flexible layer to form a first barrier (Barrier1) layer covering the first flexible layer; then depositing a layer of amorphous silicon thin film on the first barrier layer to form an amorphous silicon (a-si) layer covering the first barrier layer; then coating a layer of polyimide on the amorphous silicon layer, and forming a second flexible (PI2) layer after curing into a film; then, depositing a layer of barrier thin film on the second flexible layer to form a second barrier (Barrier2) layer covering the second flexible layer, thereby completing preparation of the base substrate 101.

In an exemplary implementation, a preparation process of the drive circuit layer 102 may include following acts.

A first insulation thin film and an active layer thin film are sequentially deposited on the base substrate 101, the active layer thin film is patterned through a patterning process to form a first insulation layer covering the entire base substrate 101 and an active layer pattern provided on the first insulation layer, and the active layer pattern includes a first active layer.

Then, a second insulation thin film and a first metal thin film are sequentially deposited. The first metal thin film is patterned through a patterning process to form a second insulation layer covering the pattern of the active layer and a pattern of a first gate metal layer arranged on the second insulation layer. The pattern of the first gate metal layer at least includes a first gate electrode, a first capacitor electrode, multiple gate lines, and multiple gate lead lines.

After that, a third insulation thin film and a second metal thin film are sequentially deposited, the second metal thin film is patterned through a patterning process to form a third insulation layer covering the first gate metal layer and a second gate metal layer pattern provided on the third insulation layer, the second gate metal layer pattern at least includes a second capacitance electrode and a second gate lead line, and a position of the second capacitance electrode corresponds to a position of the first capacitance electrode.

Next, a fourth insulation thin film is deposited, the fourth insulation thin film is patterned through a patterning process to form a fourth insulation layer pattern covering the second gate metal layer, the fourth insulation layer is provided with multiple first vias, positions of the multiple first vias respectively correspond to positions of two ends of the first active layer, and the fourth insulation layer, the third insulation layer, and the second insulation layer in the multiple first vias are etched to respectively expose a surface of the first active layer.

Then, a third metal thin film is deposited, the third metal thin film is patterned through a patterning process to form a pattern of a source-drain metal layer on the fourth insulation layer, the source-drain metal layer is formed in the display region and at least includes patterns of a first source electrode, a first drain electrode, a low voltage (VSS) line, multiple data signal lines, and multiple data lead lines, the first source electrode and the first drain electrode are respectively connected with the first active layer through a first via. In an exemplary implementation, the source-drain metal layer may further include any one or more of a power supply line (VDD), a compensation line, and an auxiliary cathode according to actual needs. The source-drain metal layer is also called a first source-drain metal layer (SDI).

Then, a fifth insulation thin film is deposited to form a pattern of the fifth insulation layer covering the source-drain metal layer.

A first flat thin film is coated on the base substrate 101 on which the aforementioned pattern is formed to form the first flat (PLN) layer covering the entire base substrate 101, a second via is formed on the first flat layer through a patterning process, the second via is formed in the display region, and the first flat layer and the fifth insulation layer in the second via are etched away to expose a surface of a first drain electrode of a first transistor 102a.

So far, a preparation of a pattern of a drive structure layer 102 on the base substrate 101 is completed. The first active layer, the first gate electrode, the first source electrode, and the first drain electrode form the first transistor 102a, the first capacitance electrode and the second capacitance electrode form a first storage capacitor 102b, and multiple gate lead lines and data lead lines form drive lead lines of a Gate Driver on Array (GOA for short). In an exemplary implementation, the first transistor 102a may be a drive transistor in a pixel drive circuit, and the drive transistor may be a thin film transistor (TFT for short).

(2) A pattern of a light-emitting structure layer 103 is formed on the base substrate on which the aforementioned pattern is formed. In an exemplary implementation, a preparation process of the light-emitting structure layer 103 may include following acts.

A transparent conductive thin film is deposited on the base substrate 101 on which the aforementioned pattern is formed, and the transparent conductive thin film is patterned through a patterning process to form a pattern of an anode 103a, the anode 103a is formed in the display region and is connected with a first drain electrode of the first transistor 102a through a second via.

A pixel defining thin film is coated on the base substrate 101 on which the aforementioned pattern is formed, and a pattern of a pixel defining layer (PDL) 103b is formed through masking, exposure and development processes, wherein the pixel defining layer 103b is provided thereon with a pixel opening, and a pixel defining thin film within the pixel opening is developed away to expose a surface of the anode 103a.

A thin film of an organic material is coated on the base substrate on which the aforementioned pattern is formed, and a pattern of multiple post spacers (PS) is formed through masking, exposure and development processes.

An organic light-emitting layer 103c and a cathode 103d are sequentially formed on the base substrate where the aforementioned pattern is formed. The organic light-emitting layer 103c may include a hole injection layer, a hole transport layer, a light-emitting layer, an electron transport layer, and an electron injection layer that are stacked, and is formed in the display region 100, so as to achieve a connection between the organic light-emitting layer 103c and the anode 103a. Since the anode 103a is connected with a drain electrode of the first transistor 102a, light emission control of an organic light-emitting layer 103c is achieved. The cathode 103d is connected with the organic light-emitting layer 103c.

(4) A second flat thin film is coated on the base substrate 101, on which the aforementioned pattern is formed, and a pattern of a second flat layer is formed on the light-emitting structure layer 103 through masking, exposure and development processes.

(5) A pattern of a color film structure layer 104 is prepared on the based substrate 101, on which the aforementioned pattern is formed. In an exemplary implementation, a preparation process of the color film structure layer 104 may include following acts.

Firstly, a polymer photoresist layer mixed with black matrix material is coated on the second flat layer, and after exposure and development, a pattern of black matrix 104a is formed; then, coating a polymer photoresist layer mixed with red pigment on the second flat layer, exposing and developing to form a pattern of a red area; using a same method and steps to form a pattern of a green area and a pattern of a blue area in turn, and finally forming a pattern of a color film of red, green and blue arranged according to certain rules.

Figure 27:
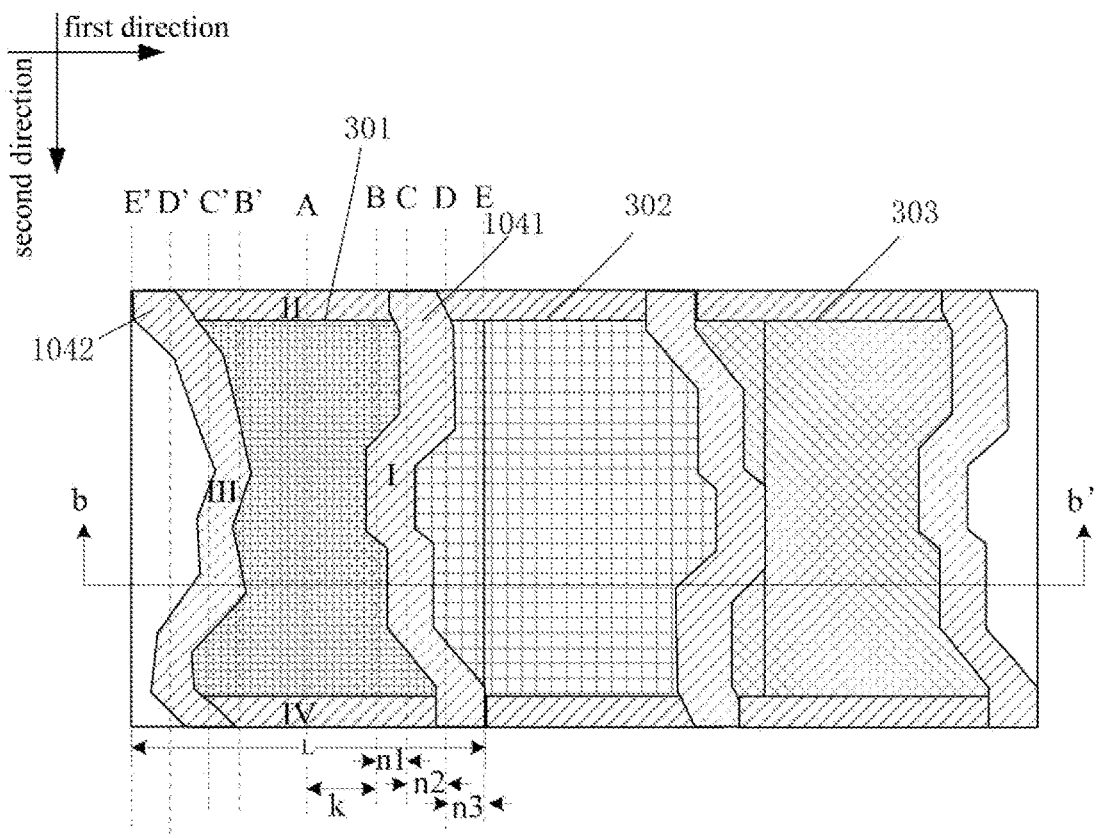
FIG. 27 is a schematic view of a structure of an anode in a sub-pixel according to an exemplary embodiment of the present disclosure.
Figure 28:
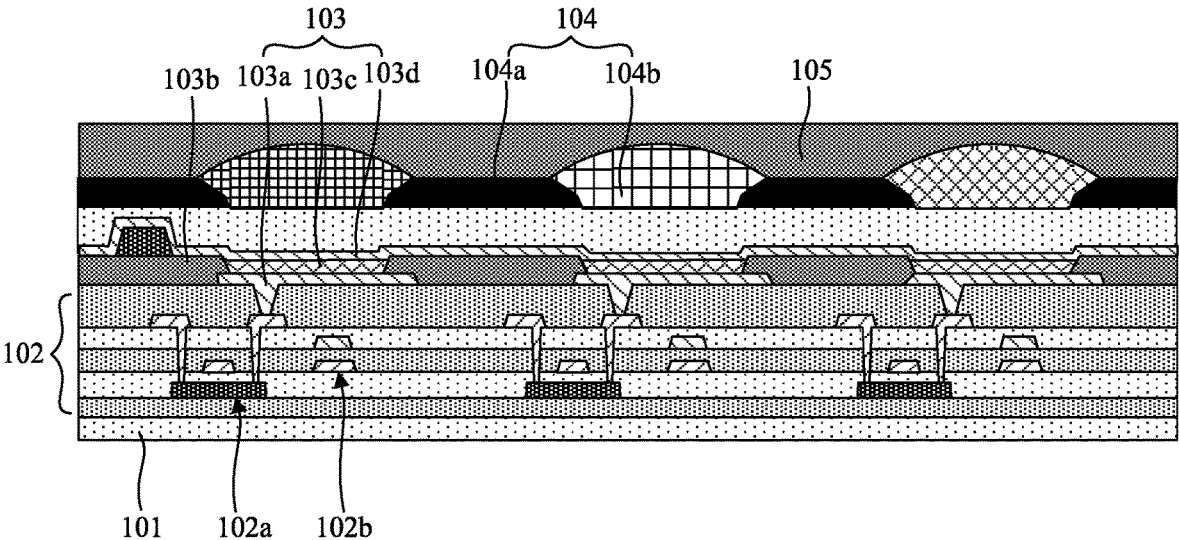
FIG. 28 is a schematic cross-sectional view of a structure of an area bb' in FIG. 27.

(4) The encapsulation layer 105 is formed on the base substrate 101, on which the aforementioned pattern is formed, the encapsulation layer 105 is formed in the display region, and made of a stacked layer structure of organic material/inorganic material, as shown in FIG. 27 and FIG. 28.

In an exemplary implementation, during preparation of a flexible display substrate, the preparation process of the display substrate may include processes such as peeling-off of a glass carrier plate, attaching of a back film, and cutting, which is not limited in the present disclosure.

As can be seen from the structure and preparation process of the display substrate of an exemplary embodiment of the present disclosure, the exemplary embodiment of the present disclosure reduces grating effects such as diffraction effect, interference effect, scattering color separation and the like by disposing the black matrix with a fold line structure, and improves the display effect; because the use of black matrix and color film reduces the reflectivity and improves the light-emission purity; since a polarizer is not used, cost is reduced, thickness of the display panel is reduced, and foldability of the display panel is improved. The preparation method of the display substrate of an exemplary embodiment of the present disclosure has good process compatibility, simple process realization, easy implementation, high production efficiency, a low production cost, and a high yield.

The structure and its preparing process in the exemplary embodiment of the present disclosure are only exemplarily described. In an exemplary implementation, a corresponding structure may be changed and a patterning process may be added or reduced according to actual needs. For example, the transistor in the drive circuit layer may have a top-gate structure, a bottom-gate structure, a single-gate structure, or a double-gate structure. For another example, the drive circuit layer and the light-emitting structure layer may also be provided therein with other film layer structures, electrode structures, or lead line structures. As a further example, the base substrate may be a glass base substrate. No specific limits are made in the present disclosure.

The present disclosure further provides a preparation method of a display substrate. In an exemplary implementation, the method may include following acts.

Forming a drive circuit layer on a base substrate;

A light-emitting structure layer is formed on a side of the drive circuit layer away from the base substrate, the light-emitting structure layer includes a pixel defining layer and an organic light-emitting layer, the pixel defining layer defines multiple sub-pixel regions and includes a first opening at least partially exposing the drive circuit layer, the organic light-emitting layer is located in the sub-pixel regions and overlapped with the first opening of the pixel defining layer;

a color film structure layer is formed on a side of the light-emitting structure layer away from the base substrate, the color film structure layer includes a color film and a black matrix, the black matrix includes a second opening at least partially exposing the first opening, the color film is provided in the second opening, the black matrix includes a first sub-side, and the first sub-side includes a fold line structure.

Following points need to be noted.

The drawings of the embodiments of the present disclosure only involve structures involved in the embodiments of the present disclosure, and other structures may refer to usual designs.

The embodiments in the present disclosure, i.e., features in the embodiments, may be combined with each other to obtain new embodiments if there is no conflict.

Although the implementations disclosed in the present disclosure are as above, the described contents are only implementations used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display substrate, comprising:

a base substrate;

a drive circuit layer provided on the base substrate;

a light-emitting structure layer provided on a side of the drive circuit layer away from the base substrate, wherein the light-emitting structure layer comprises a pixel defining layer and an organic light-emitting layer, the pixel defining layer defines a plurality of sub-pixel regions and comprises a first opening at least partially exposing the drive circuit layer, the organic light-emitting layer is located in a sub-pixel region and overlapped with the first opening of the pixel defining layer;

and a color film structure layer provided on a side of the light-emitting structure layer away from the base substrate, wherein the color film structure layer comprises a color film and a black matrix, the black matrix comprises a second opening at least partially exposing the first opening, the color film is provided in the second opening, the black matrix comprises a first sub-side, and the first sub-side comprises a fold line structure, wherein the first sub-side has a first width along a first direction; the drive circuit layer comprises at least one first signal line, the first signal line has a second width along the first direction, an orthographic projection of the first signal line on the base substrate and an orthographic projection of the first sub-side on the base substrate have a first overlap, and the first overlap has a third width along the first direction.

2. The display substrate according to claim 1, wherein the first sub-side comprises a plurality of fold angles, and the farther in a region away from a center line of the sub-pixel region, the greater a quantity of the fold angles of the first sub-side is.

3. The display substrate according to claim 1, wherein the sub-pixel region comprises a center line, a first reference line, a second reference line, a third reference line, and a fourth reference line in sequence along the first direction, the fourth reference line coincides with a farthest border of the first sub-side on a side away from the center line, wherein:

a distance between the first reference line and a center line of the sub-pixel region is k, a distance between the first reference line and the second reference line is n1, a distance between the second reference line and the third reference line is n2, and a distance between the third reference line and the fourth reference line is n3; $k+n1+n2+n3=L/2$, where L is a length of the sub-pixel region along the first direction;

a quantity x of fold angles between the center line and the first reference line, a quantity y of fold angles between the first reference line and the second reference line, and a quantity z of fold angles between the second reference line and the third reference line of the first sub-side meet following conditions: $x \leq y \leq z$.

4. The display substrate according to claim 3, wherein a quantity of fold angles of the first sub-side between the center line and the first reference line $x \geq 3$;

a quantity of fold angles of the first sub-side between the first reference line and the second reference line $y \geq 3$; and, a quantity of fold angles of the first sub-side between the second reference line and the third reference line $z \geq 3$.

5. The display substrate according to claim 3, wherein the first sub-side comprises at least two fold angles substantially equal between the center line and the first reference line;

the first sub-side comprises at least two fold angles substantially equal between the first reference line and the second reference line; and, the first sub-side comprises at least two fold angles substantially equal between the second reference line and the third reference line.

6. The display substrate according to claim 3, wherein the first sub-side comprises at least one first fold angle between the center line and the first reference line, the first sub-side comprises at least one second fold angle between the first reference line and the second reference line, the first sub-side comprises at least one third fold angle between the second reference line and the third reference line, and angles of the first fold angle, the second fold angle, and the third fold angle are substantially equal.

7. The display substrate according to claim 3, wherein the first sub-side comprises at least three fold angles between the center line and the first reference line: x1, x2, x3, where x2 and x3 are substantially equal, and x1+x2 is substantially equal to 360 degrees;

the first sub-side comprises at least four fold angles between the first reference line and the second reference line: y1, y2, y3 and y4, where y1 and y2 are substantially equal, and y3+y4 is substantially equal to 360 degrees;

the first sub-side comprises at least four fold angles between the second reference line and the third reference line: z1, z2, z3 and z4, where z1 and z2 are substantially equal, and z3+z4 is substantially equal to 360 degrees.

8. The display substrate according to claim 1, wherein the first signal line has a fold line structure, the black matrix has a plurality of sub-sides, and a quantity of fold angles of the first signal line in any sub-pixel region is less than a quantity of fold angles of at least one sub-side of the black matrix and greater than a quantity of fold angles of at least one another sub-side of the black matrix.

9. The display substrate according to claim 1, wherein the first width is 11, the second width is 12, the sub-pixel region comprises a center line and a first reference line along the first direction, a distance between the first reference line and a center line of the sub-pixel region is k, and a length of the sub-pixel region along the first direction is L, then: $10*11 \leq L \leq 10*12$; $2*k < L \leq 3*k$.

10. The display substrate according to claim 1, wherein an orthographic projection of the color film on the base substrate at least partially covers an orthographic projection of the first opening of the pixel defining layer on the base substrate;

in a third direction, a maximum thickness of the color film is greater than a maximum thickness of the first sub-side, and the color film at least partially covers the first sub-side, and the third direction is a direction along the base substrate toward the color film structure layer.

11. The display substrate according to claim 1, wherein the black matrix has a second thickness 14 in a third direction, the second thickness is between 0.9 microns and 1.2 microns, the third direction is a direction along base substrate toward the color film structure layer.

12. The display substrate according to claim 1, wherein the first sub-side comprises a third sub-line segment that is neither parallel nor perpendicular to the first direction and the second direction, and the black matrix comprises a plurality of third sub-line segments.

13. The display substrate according to claim 1, wherein the black matrix further comprises a second sub-side provided opposite to the first sub-side, and the second sub-side has a fold line structure, the first sub-side and the second sub-side are provided asymmetrically with respect to a center line of the sub-pixel region.

14. The display substrate according to claim 1, wherein the sub-pixel region comprises a first sub-pixel region, a second sub-pixel region, and a third sub-pixel region, the first sub-pixel region comprises a first light-emitting unit and a first color film, the second sub-pixel region comprises a second light-emitting unit and a second color film, the third sub-pixel region comprises a third light-emitting unit and a third color film, an orthographic projection of the first color film on the base substrate covers an orthographic projection of the first light-emitting unit on the base substrate, an orthographic projection of the second color film on the base substrate covers an orthographic projection of the second light-emitting unit on the base substrate, and an orthographic projection of the third color film on the base substrate covers an orthographic projection of the third light-emitting unit on the base substrate.

15. The display substrate according to claim 1, wherein the display substrate further comprises an encapsulation layer provided on a side of the color film structure layer away from the light-emitting structure layer and an orthographic projection of the encapsulation layer on the base substrate covers an orthographic projection of the color film structure layer on the base substrate.

16. The display substrate according to claim 1, wherein the sub-pixel region comprises a first sub-pixel region, a second sub-pixel region, a third sub-pixel region, and a fourth sub-pixel region, the first sub-pixel region comprises a first light-emitting unit and a first color film, the second sub-pixel region comprises a second light-emitting unit and a second color film, the third sub-pixel region comprises a third light-emitting unit and a third color film, the fourth sub-pixel region comprises a fourth light-emitting unit and a fourth color film, an orthographic projection of the first color film on the base substrate covers an orthographic projection of the first light-emitting unit on the base substrate, an orthographic projection of the second color film on the base substrate covers an orthographic projection of the second light-emitting unit on the base substrate, an orthographic projection of the third color film on the base substrate covers an orthographic projection of the third light-emitting unit on the base substrate, and an orthographic projection of the fourth color film on the base substrate covers an orthographic projection of the fourth light-emitting unit on the base substrate.

17. The display substrate according to claim 16, wherein the first sub-pixel region is a red sub-pixel region, the second sub-pixel region is a green sub-pixel region, the third sub-pixel region is a blue sub-pixel region, and the fourth sub-pixel region is a white sub-pixel region.

18. The display substrate according to claim 1, wherein the display substrate further comprises a blank structure and an orthographic projection of the blank structure on the base substrate is not overlapped with an orthographic projection of the sub-pixel region on the base substrate.

19. The display substrate according to claim 18, wherein a ratio of an area of the blank structure to an area of the sub-pixel region is greater than or equal to 45%.

20. The display substrate according to claim 18, wherein the plurality of sub-pixel regions comprise a white sub-pixel region and a red sub-pixel region, the blank structure has a first sub-edge adjacent to a first sub-side of the white sub-pixel region and a first sub-side of the red sub-pixel region, a shape of the first sub-edge is conformal with a shape of the first sub-side of the white sub-pixel region and the first sub-side of the red sub-pixel region.

21. The display substrate according to claim 1, wherein the light-emitting structure layer further comprises an anode, the first opening at least partially exposes the anode, and at least one sub-pixel region comprises a plurality of sub-anode blocks provided separately.

22. A display apparatus, comprising the display substrate according to claim 1.

\* \* \* \* \*